(12) United States Patent
Wittenberg et al.

(10) Patent No.: US 8,708,584 B2
(45) Date of Patent: Apr. 29, 2014

(54) SYSTEMS AND METHODS FOR COUPLING A COVER TO AN ENCLOSURE

(71) Applicant: Apple Inc., Cupertino, CA (US)

(72) Inventors: Mike Wittenberg, Sunnyvale, CA (US); David Pakula, San Francisco, CA (US); Scott Myers, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/857,921

(22) Filed: Apr. 5, 2013

(65) Prior Publication Data
US 2013/0240112 A1 Sep. 19, 2013

Related U.S. Application Data

(62) Division of application No. 12/987,920, filed on Jan. 10, 2011, now Pat. No. 8,434,951.

(51) Int. Cl.
*G03B 17/04* (2006.01)
*G03B 11/04* (2006.01)
*G03B 17/00* (2006.01)

(52) U.S. Cl.
CPC ............... *G03B 17/04* (2013.01); *G03B 11/04* (2013.01); *G03B 17/00* (2013.01)
USPC .............................. 396/448; 156/60; 345/156

(58) Field of Classification Search
CPC .......... G03B 11/04; G03B 17/00; G03B 17/02
USPC ........................................................... 396/448
See application file for complete search history.

(56) References Cited

U.S. PATENT DOCUMENTS

| 7,957,762 B2 * | 6/2011 | Herz et al. ................. 455/550.1 |
| 2011/0186345 A1 * | 8/2011 | Pakula et al. ................. 174/520 |
| 2012/0037523 A1 * | 2/2012 | Diebel et al. ................. 206/320 |

* cited by examiner

*Primary Examiner* — Clayton E Laballe
*Assistant Examiner* — Kevin Butler
(74) *Attorney, Agent, or Firm* — Jennifer Luh

(57) ABSTRACT

An electronic device may include a proximity sensor for determining when a user's face is near the device. The sensor can include an emitter and a detector that are separated by a foam block to limit cross-talk between the emitter and detector.
A sheet can be placed over the foam block to define openings for each of the emitter and detector. Some electronic devices can also include a camera. A glass cover secured to the device enclosure can protect the camera. To improve an adhesive bond between the glass cover and a metal enclosure, an ink layer can be placed between an adhesive and the glass. During assembly, the position of the camera can shift due to closing an enclosure.
A grounding assembly that maintains contact with the camera in its initial and final positions may be provided.

20 Claims, 16 Drawing Sheets

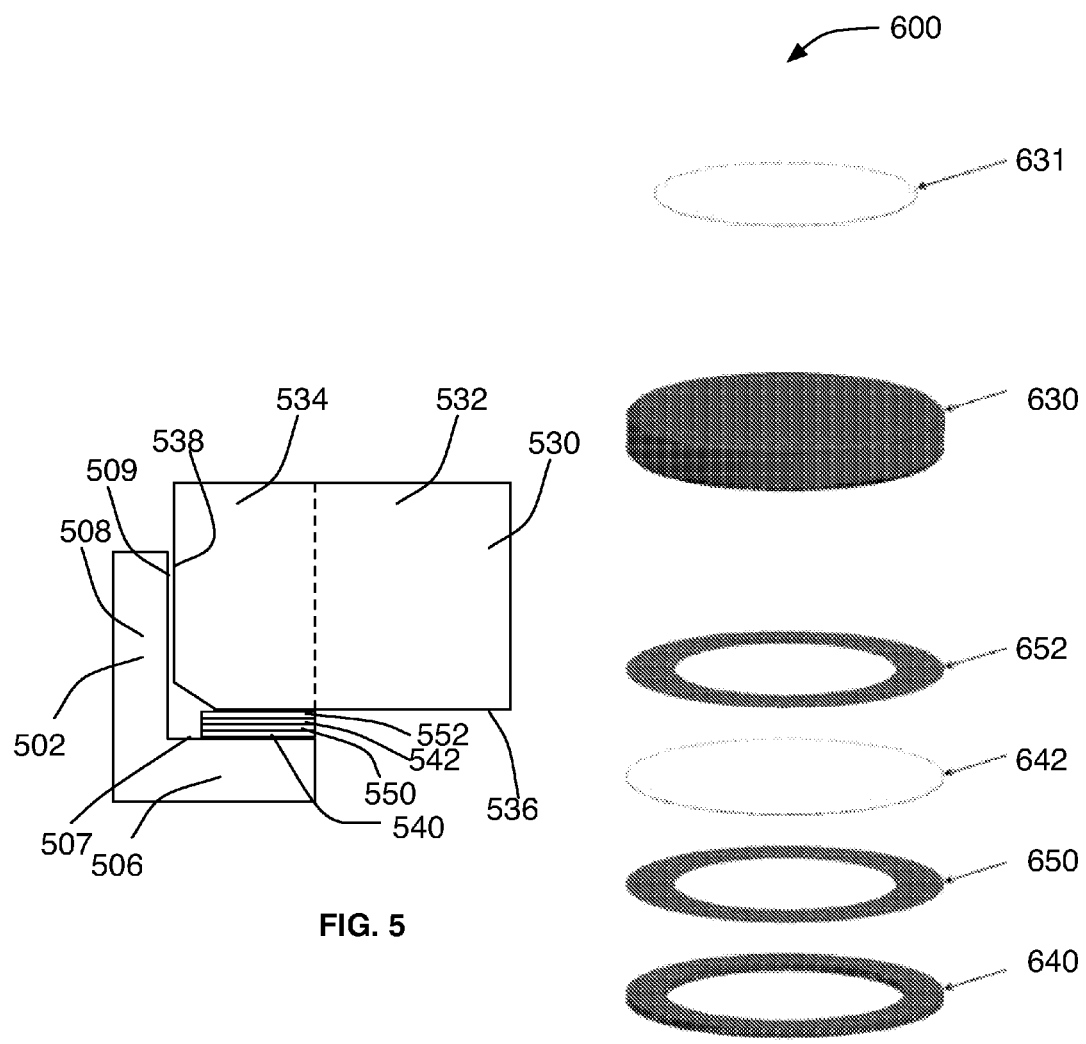

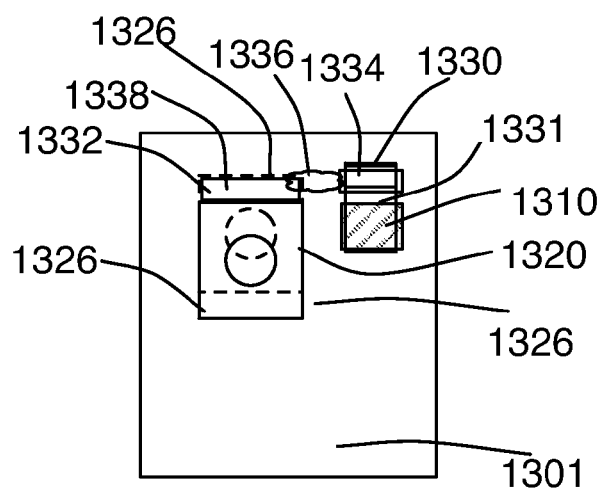
FIG. 13
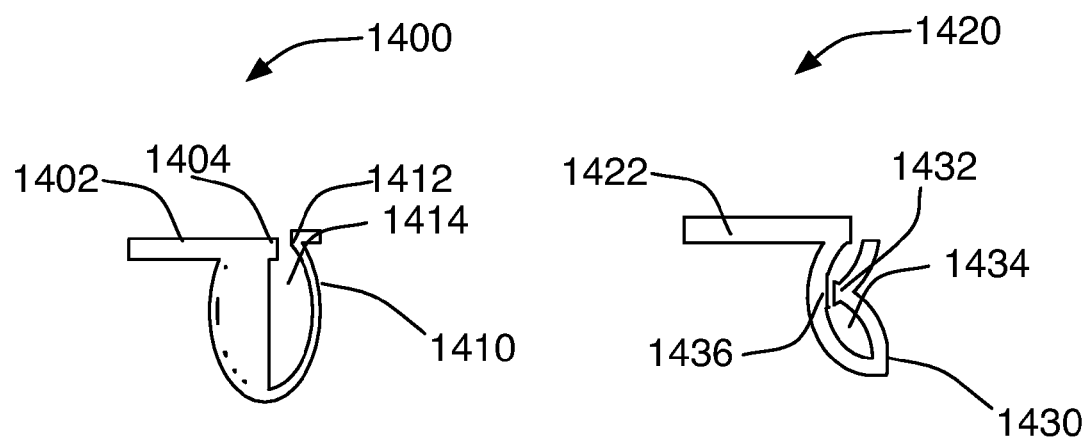
FIG. 14A
FIG. 14B

SYSTEMS AND METHODS FOR COUPLING A COVER TO AN ENCLOSURE

This application claims priority to U.S. patent application Ser. No. 12/987,920 filed on Jan. 10, 2011, which is hereby incorporated by reference herein in its entirety.

BACKGROUND

Electronic devices can include a variety of components that provide functionality to the devices. For example, some devices can include a proximity sensor. As another example, some devices can include a camera for capturing images (still images or video). As still another example, some devices can include circuitry or sensors for detecting how it being used, such as whether a face is close by so that the touch screen should be deactivated. The camera, sensors, or other circuitry can be incorporated in the electronic device using different approaches. In some cases, however, it may be desirable to mount or connect the camera, sensors, or other circuitry in a manner that enhances the reliability and precision of outputs provided by the camera, sensors or other circuitry.

SUMMARY

An electronic device can include several sensors for detecting how the device is used. In some cases, an electronic device can include a proximity sensor having an emitter emitting light. The light can be reflected outside of the device, and be detected by a detector. The emitter and detector can be placed underneath a glass cover to prevent damage to the components. To ensure a proper operation of the sensor, one or more foam blocks can be placed at least between the emitter and detector to prevent cross talk, or light emitted by the emitter being detected by the detector without passing through the glass cover and into the environment (e.g., detection of emitted light due to reflection within the device). In some cases, one or both of the emitter and detector can be surrounded by foam blocks.

The disposition of the foam blocks, and the size of openings within the blocks for each of the emitter and detector, can affect the performance of the sensor. Therefore, it may be desirable to utilize different configurations of blocks providing different openings for each component of the sensor in order to tune the sensor performance. Creating different foam blocks, and placing them accurately in the device in a consistent manner for testing, however, may be an expensive, time-consuming, and/or difficult endeavor.

To improve performance of the sensor, a sheet of material can be applied to a top surface of foam blocks. The material used for the sheet can be more robust or rigid than the material used for the foam block, such that manipulation of the sheet is less likely to damage the foam block than direct manipulation of the foam block. For example, the sheet can be constructed from Mylar adhered to a surface of the foam blocks. The sheet can also be used to facilitate testing of the sensor.

In some cases, different sheets of material can be provided on a single size of foam blocks. Each sheet of material can be sized such that the sheet of material extends beyond a periphery of a surface of the foam blocks. Using this approach, the sheet boundaries can define the size and shape of openings for each of the emitter and detector. Each of the different sheets, however, can be supported by a single size or type of foam block. This can reduce costs and accelerate the timeframe for tuning a proximity sensor, which can thereby increase the likelihood that the sensor will have superior performance in the device.

Some electronic devices can include a camera for capturing images. The camera can be enclosed within an electronic device to protect components of the camera, such as the lens, from damage. The enclosure can include a transparent cover through which light from the environment can be transmitted and so that it reaches the camera. The cover can be treated or include one or more coatings for improving the performance of the camera. For example, an oleophobic coating can be applied to an exterior surface of the cover, and an infrared filter can be applied to an interior surface of the cover.

The cover can be secured to any suitable portion of the electronic device enclosure. In some cases, the enclosure can include an opening over which the cover is placed. The opening can be smaller than the cover, such that a ring around a periphery of the cover can come into contact with a portion of the enclosure (e.g., an edge) forming a ring around the opening. An adhesive (e.g., a pressure sensitive adhesive) can be applied around the opening to secure the cover to the enclosure.

Some adhesives, however, may have difficulty bonding to glass (e.g., the cover) or to metal (e.g., the enclosure). To improve the bond provided by the adhesive, an ink layer can be provided over the adhesive. For example, an ink layer can be applied to the ring around the periphery of the cover such that the ink layer is between the cover and the adhesive (which is placed in contact with the enclosure). In some cases, a filter or coating can be applied to the cover. For example, an infrared filter can be applied to a surface of the cover. Then, a second ink layer can be placed between the cover and the infrared filter to improve the adhesive of the infrared filter to the cover. The enclosure and cover can be heated to improve the bond provided by the adhesive. The enclosure and cover can be secured within a fixture, which can be constructed from silicon, to be heated.

Some electronic device components may need to be grounded to operate properly. For example, providing a conductive path for a component to ground can reduce or eliminate potential interferences caused by antennas, or by radiation emitted by other components. In some cases, a component such as a camera may need to be grounded by providing a conductive path between a housing of the camera and a grounding platform of the device (e.g., a portion of or connected to the enclosure).

In some cases, a component may move relative to an enclosure during assembly. For example, a camera can be placed in an initial position during the assembly process, and subsequently be slid to a final position later in the process, such as when a cover closing the enclosure is placed over the camera and slid into place. To ensure that the camera operates properly, it may be desirable to ground the camera in both the initial position and in the final position. This may require a grounding assembly that includes a movable component that can accommodate the change in position of the camera.

The grounding assembly can take any suitable form. In some cases, the grounding assembly can include a spring having several different arms that deflect in different manners. The amount of deflection of arms can vary based on the position of the camera. Alternatively, the grounding assembly can include a clip and a flex. The flex can include a flexible section between two rigid sections. A rigid section can be connected to each of the camera and to the grounding platform such that the flexible section can deform to accommodate the different positions of the camera during the assembly process and after the process is complete.

BRIEF DESCRIPTION OF THE DRAWINGS

The above and other features of the present invention, its nature and various advantages will be more apparent upon consideration of the following detailed description, taken in conjunction with the accompanying drawings in which:

FIG. 5 is a detailed section view of an interface between a cover and an edge in accordance with some embodiments of the invention;

FIG. 6 is an exploded view of several layers applied to a cover in accordance with some embodiments of the invention;

FIG. 13 is a schematic view of a camera housing grounded using a clip in accordance with some embodiments of the invention;

FIG. 14A is a schematic view of an illustrative clip for grounding a camera in accordance with some embodiments of the invention;

FIG. 14B is a schematic view of another illustrative clip for grounding a camera in accordance with some embodiments of the invention;

DETAILED DESCRIPTION

An electronic device can include several sensors for providing information to the device. Such sensors can include, for example, a proximity sensor and a camera. The sensors can be incorporated in the device such that their functionality is assured while protecting the sensors for damage due to use of the device. In addition, the process for assembling the sensor can be improved, thus improving the reliability and performance of the sensor.

Figure 1A:
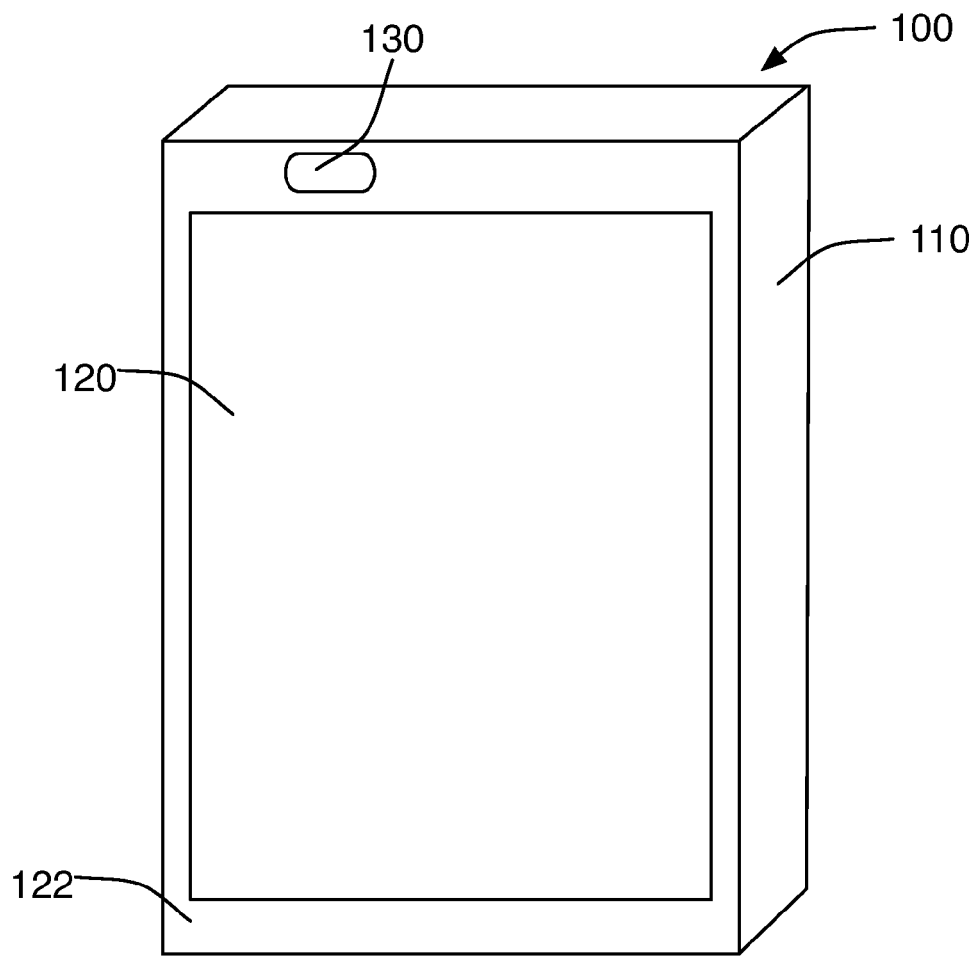
FIG. 1A is a perspective view of an electronic device having sensors in accordance with some embodiments of the invention.
Figure 1B:
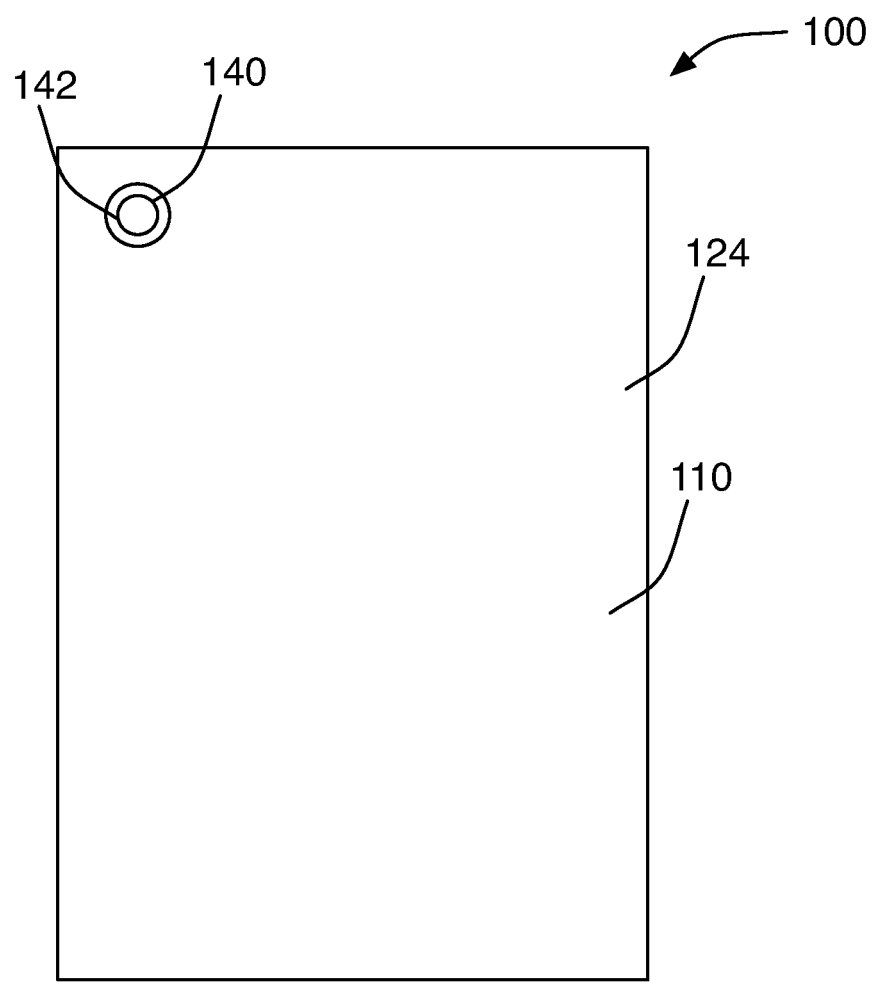
FIG. 1B is a back view of the electronic device of FIG. 1A in accordance with some embodiments of the invention.

FIG. 1A is a perspective view of an electronic device having sensors in accordance with some embodiments of the invention. FIG. 1B is a back view of the electronic device of FIG. 1A in accordance with some embodiments of the invention. Electronic device 100 can include enclosure 110 defining exterior surfaces of the device. Enclosure 110 can be constructed from one or more components that can be combined to provide a structure for the device. For example, enclosure 110 can include a housing in which device components are placed or mounted. As another example, enclosure 110 can include a band defining a periphery of the device, and covers placed over the band. Enclosure 110 can be constructed from any suitable material including, for example, a metal (e.g., aluminum or stainless steel), plastic, composite material, or combinations of these. In some cases, the materials used can be selected to take advantage of one or more of mechanical properties or cosmetic attributes.

Electronic device 100 can include display region 120 through which information can be provided to a user. Display region 120 can extend over any suitable portion of enclosure 110. In some cases, display region 120 can extend over most or all of a front surface, a back surface, or both surfaces of enclosure 110. Display circuitry placed underneath the display region can be controlled by a processor or other control circuitry to provide information viewable by a user. In some cases, display region 120 can have a larger size than the display circuitry. For example, display region 120 can include a glass component having dark bands around a periphery of portion of display region covering the display circuitry. Alternatively, display region 120 can include a portion of a larger component serving as a cover within enclosure 110. For example, display region 120 can correspond to a region of glass window 122 placed over a band.

To provide different functionality to a user, electronic device 100 can include different sensors. For example, electronic device 100 can include proximity sensor 130 positioned such that a portion of sensor 130 can interface with the outside of electronic device 100 is placed. Sensor 130 can be placed adjacent to a portion of window 122 such that light or other radiation can be transmitted between sensor 130 and the device environment through window 122. In some cases, window 122 can include one or more transparent or translucent regions surrounded by opaque regions for defining specific regions through which light can pass as it leaves the sensor or reaches the sensor. For example, an emitter of sensor 130 can be placed adjacent to a first transparent region of window 122, and a detector of sensor 130 can be placed adjacent to a second transparent region of window 122. In some cases, the opaque regions can be defined using any suitable approach including, for example, by an ink layer applied to the window.

In addition to sensor 130, electronic device 100 can include camera 140 for capturing images. Camera 140 can be placed in any suitable portion of enclosure 110 including, for example, adjacent to window 122 or to back cover 124. To allow a lens of camera 140 to capture images, camera 140 can be exposed within enclosure. It may be desirable, however, to provide cover 142 over camera 140 to protect the camera lens from damage. Cover 142 can be incorporated in enclosure 110 such that light can be transmitted through cover 142 and enclosure 110 and to camera 140. In some cases, cover 142 can be a component distinct from back cover 122 that is placed within an opening of back cover 122. Alternatively, cover 142 can be constructed from a portion of back cover 122.

Figure 2A:
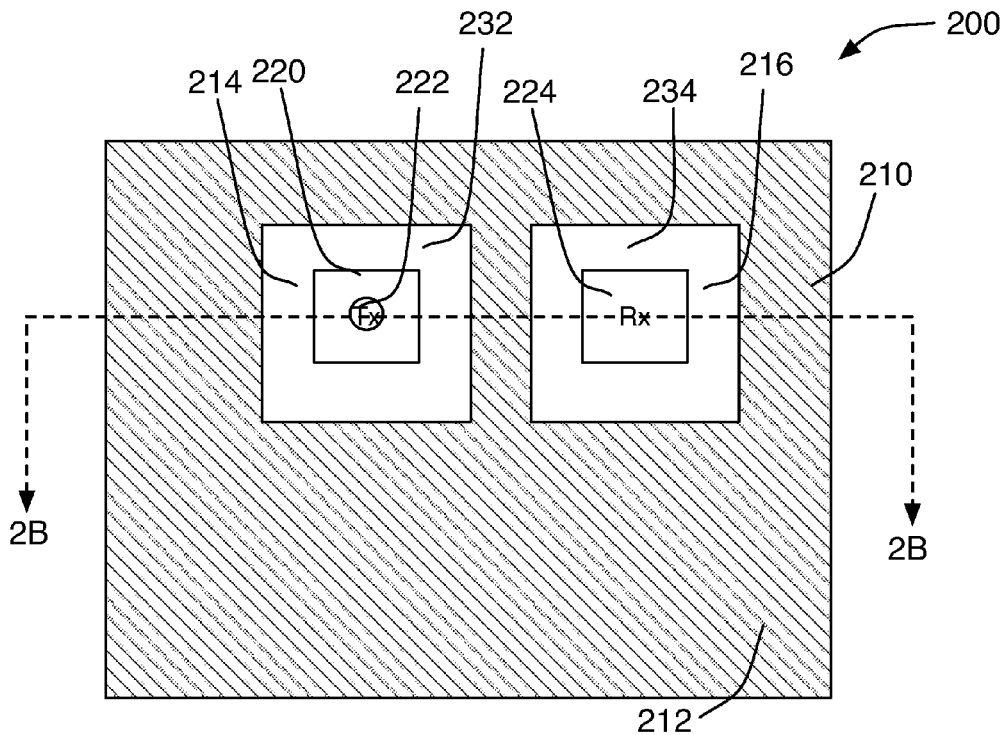
FIG. 2A is a front view of a proximity sensor incorporated in an electronic device in accordance with some embodiments of the invention.

FIG. 2A is a front view of a proximity sensor incorporated in an electronic device in accordance with some embodiments of the invention. Electronic device 200 can include glass cover 210 providing an external surface of the device. Glass cover 210 can include translucent or transparent regions 214 and 216, and opaque region 212. Any suitable approach can be used to render regions 214 and 216 transparent, and region 212 opaque. For example, regions 214 and 216 can be polished or etched. As another example, an ink layer or other opaque material can be deposited on region 212. The material selected for opaque region 212 may be such that light or other radiation may not pass through opaque region 212, but must instead pass through one of regions 214 and 216, for example to reach proximity sensor 220 aligned with one or both of regions 214 and 216. Regions 214 and 216 can have any suitable size including, for example, the same or different sizes. In some cases, the sizes may be determined from the sizes of emitter 222 and detector 224.

In some cases, proximity sensor 220 can include at least two distinct components that combine to determine the distance between objects and the device. In particular, proximity sensor 220 can include emitter 222 operative to emit light that passes through region 214, and detector 224 operative to receive light that passes through region 216. Emitter 222 can include any component operative to emit or transmit light or other forms of radiation. For example, emitter 222 can include a LED or other light source. Light provided by emitter 222 can be transmitted through region 214 of cover 210 at any suitable interval. In some cases, control circuitry of the device can establish intervals or moments in time at which light is to be emitted. Light can be emitted continuously, as pulses, or as combinations of these.

Light emitted by emitter 222 and passing through cover 210 can be reflected by objects around the device such that a portion of the reflected light can be return through region 216 of cover 210. Detector 224 can be placed adjacent to region 216 such that reflected light may be detected by detector 224. Detector 224 can include any suitable circuitry for detecting light or other forms of radiation emitted by emitter 222, or changes in light or other forms of radiation corresponding to emissions of emitter 222. For example, detector 224 can include a capacitive, optical, or resistive component for detecting changes in a measurable property.

To improve sensor performance, emitter 222 and detector 224 can be placed in cavities 232 and 234, respectively, such that the sensor components are offset from side walls or boundaries of a sensor body in which cavities 232 and 234 are formed. This may allow more light emitted by emitter 222 to be transmitted through cover 210, and may allow more light reflected by the environment to be detected by detector 224.

It may be necessary to limit the amount of light or other radiation emitted by emitter 222 that is detected by detector 224 without being reflected by the environment (e.g., limit cross-talk) to ensure a proper operation of sensor 220. In particular, it may be necessary to ensure that emitted radiation is not transmitted within electronic device 200 and immediately detected by detector 224, as this may result in a false detection of an object near sensor 220. Several approaches can be used to isolate emitter 222 from detector 224. As a first approach, cover 210 can include an opaque region separating transparent regions associated with each of emitter 222 and detector 224. The opaque region may eliminate most or all paths for light internally reflected by cover 210 between emitter 222 and detector 224.

Figure 2B:
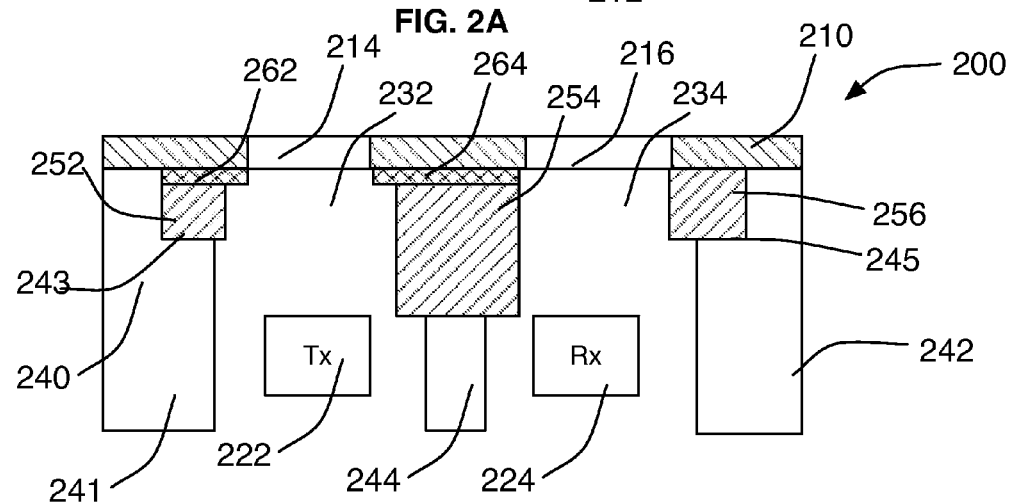
FIG. 2B is a sectional view of the proximity sensor of FIG. 2A in accordance with some embodiments of the invention.

In some cases, electronic device 200 can include material placed between emitter 222 and detector 224 for preventing cross talk between the sensor components (e.g., by placing emitter 222 in cavity 232, and placing detector 224 in cavity 234). As shown in FIG. 2B, emitter 222 can be secured between side wall 240 and center wall 244 of body 241, and detector 224 can be secured between center wall 244 and side wall 242 of body 241. Side walls 240 and 242 can, in at least some regions, extend to cover 210 such that the cover can be placed in contact with the side walls. Some materials selected for body 241 and cover 210 may be such that light is reflected or transmitted at or near the interface between the components, which may adversely affect the operation of sensor 220. To absorb excess emissions and prevent cross-talk, electronic device 200 can include a compliant and opaque material placed between body 241 and cover 210 around a periphery of regions 214 and 216 (e.g., around a periphery of the openings of cavities 232 and 234).

Figure 2C:
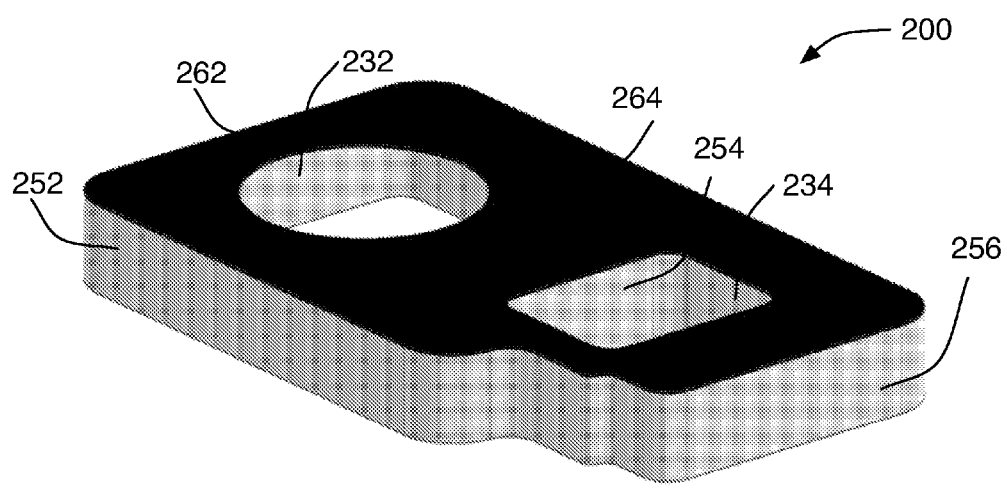
FIG. 2C is a perspective view of an illustrative foam block with an integrated sheet for use in a proximity sensor in accordance with some embodiments of the invention.

Electronic device 200 can include foam block 252 placed in ledge 243 of side wall 240 such that foam block 252 provides an interface between side wall 240 and cover 210 around a portion of the periphery of region 214 (e.g., the height of the ledge, or the distance between the ledge and an outer surface of body 241 is smaller than the height of foam block 252). Similarly, electronic device 200 can include foam block 254 placed between center wall 244 and cover 210 to provide an interface around another portion of the periphery of region 214. Foam block 254 can be aligned with center wall 244 using any suitable approach including, for example, using protruding or recessed features in an upper or exposed surface of center wall 244. In some cases, foam blocks 252 and 254, alone or in combination with other foam blocks, can surround a periphery of region 214 adjacent to cover 210 to improve the performance of emitter 222. For example, as shown in FIG. 2C, foam blocks 252, 254 and 256 can be part of a single foam block that surrounds an emitter and a detector, corresponding to cavities 232 and 234, respectively.

Figure 2D:
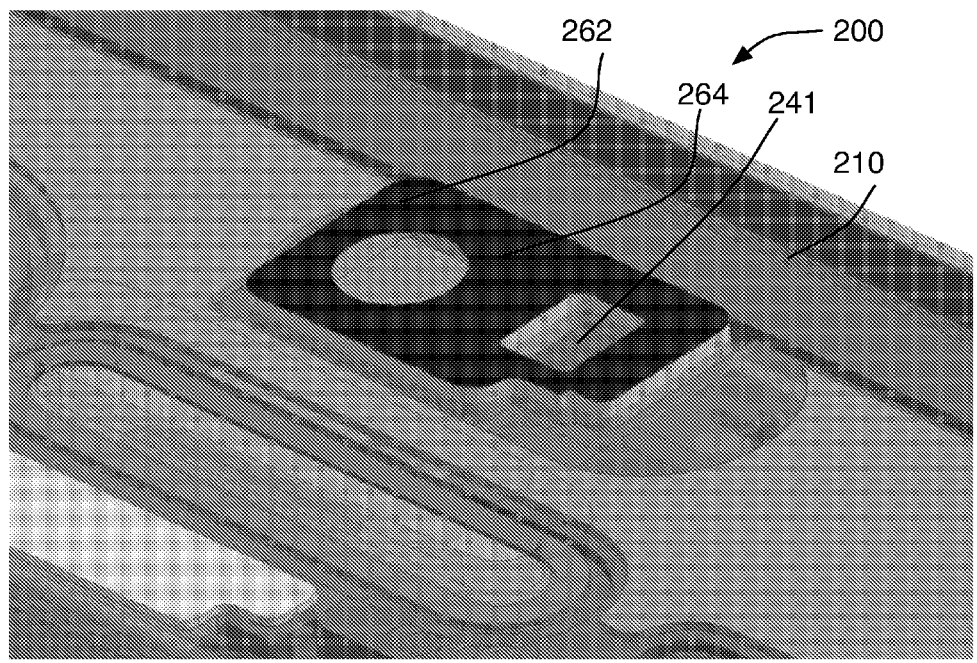
FIG. 2D is a perspective view of the foam block with an integrated sheet of FIG. 2C placed in an electronic device enclosure in accordance with some embodiments of the invention.

Electronic device 200 can include foam block 256 placed in ledge 245 of side wall 242 such that foam block 256 provides an interface between side wall 242 and cover 210 around a portion of the periphery of region 216. Foam block 254, placed over center wall 246, can extend over center wall 246 such that different sides of foam block 254 provide interfaces between center wall 246 and cover 210 for each of regions 214 and 216. Similar to region 214, foam blocks 256 and 254, alone or in addition with other foam blocks, can surround a periphery of region 216 adjacent to cover 210 to improve the performance of detector 224. In some cases, as shown in FIGS. 2C and 2D, foam blocks 252, 254 and 256 can be part of a single foam block.

Each of the foam blocks can be secured within electronic device 200 using any suitable approach. In some cases, a foam block can be retained by compression forces applied to the foam block by cover 210 and a side wall or center wall (e.g., as shown in FIG. 2D). For example, a foam block can be placed in a ledge of a side wall, or on an upper surface of a center wall, and be at least partially compressed such that it is press fit between the side wall or center wall and cover 210 when cover 210 is placed on the device. In such cases, each foam block can be sized such that the height of the foam block is larger than the height of a ledge (e.g., a distance between a portion of a wall on which the foam block will lie and a cover). The height selected for the foam block can be determined from one or more of the type of material used for the foam block, the elasticity or sponginess of the foam block material, the space in the device for the foam block, properties of the sensor (e.g., the type of light emitted), or combinations of these.

In other cases, an adhesive or other securing mechanism can be used to secure a foam block to one or more of a wall and the cover. For example, a heat sensitive, pressure sensitive, or other adhesive can be used to secure a foam block to a ledge in a side wall, or to a top surface of a center wall. As another example, tape can be used to secure a foam block to any exposed surface of a wall (e.g., a top or side surface of a side wall) or of the cover. As still another example, a mechanical fastener can be used.

The performance of sensor 220 may, in some cases, depend on the distance between foam blocks 252 and 254, and on the distance between foam blocks 254 and 256. More specifically, the performance of sensor 220 may depend on the size of regions 214 and 216 in cover 210, where the dimensions of the regions may be defined by the distance between the foam blocks within cavity 232 in which emitter 222 is placed, the distance between the foam blocks within cavity 234 in which detector 224 is placed, or both. Therefore, the particular dimensions and shape of each foam block can be critical to the performance of sensor 220.

When electronic device 200 is constructed, each foam block can be individually placed adjacent to a wall. Because the material used for each foam block may be compliant, some blocks may be deformed or damaged as they are assembled, which can adversely affect the performance of sensor 220. In addition, to test the performance of sensor 220, it may be desirable to test different sizes of regions 214 and 216. Accordingly, foam blocks having different sizes can be defined and used to test different sizes of open regions through which light or other radiation associated with sensor 220 can be transmitted. The process of creating of each foam block may be expensive, and due to the fragile nature of each foam block, testing results may be unreliable or costly.

To improve the reliability of the foam blocks used for sensor 220, and to facilitate testing different attributes of sensors, a sheet of material can be embedded on a surface of one or more foam blocks. For example, a sheet of material can be provided on an upper or top surface of a foam block such that the sheet of material is between the foam block and cover 210. In the example of FIG. 2B, electronic device 200 can include sheet 262 placed adjacent to foam block 252, and sheet 264 placed adjacent to foam block 254. In some cases, a sheet can instead or in addition be provided adjacent to foam block 256. Electronic device 200 can include several distinct sheets, for example corresponding to different foam blocks, or a single sheet extending continuously around a periphery of region 214 and 216. In the example of FIGS. 2C and 2D, sheet 262 and 264 correspond to different portions of a single sheet that covers the entirety of the foam block used for the sensor.

Each sheet can have any suitable size. In some cases, a sheet can be larger than a surface of a foam block (e.g., larger than a top surface of a foam block) such that a boundary of the sheet extends beyond a boundary of a foam block. The boundary of the sheet can then define a periphery for one of regions 214 and 216. The sheet may, in some embodiments, be no smaller than a surface of a foam block on which it is placed (e.g., the sheet is at least as big as a top surface of the foam block). The sheet can have any suitable height or thickness including, for example, a thickness selected to ensure suitable mechanical properties while limiting the size of the sheet. In some cases, the sheet thickness may be substantially smaller than a height of a foam block adjacent to the sheet.

The amount by which a sheet extends beyond a boundary of a foam block can be tuned to improve or enhance the performance of sensor 220. For example, several sheets having different dimensions can be coupled to a single size foam block for testing. This approach may be beneficial, as manufacturing a variety of foam blocks may be a complex, time consuming, or expensive process, while cutting sheets in different sizes may be quick and cheaper.

The sheets can be constructed from any suitable material. In some cases, the material can be selected based on mechanical or material properties. For example, a material can be selected to have a particular robustness, stiffness or resistance to forces applied during assembly. As another example, a material can be selected based on its rigidity (e.g., to maintain its shape once sensor 220 is assembled). As still another example, the material can be selected based on absorption, transmission, or reflectivity properties corresponding to the type of radiation or light emitted by sensor 220. A suitable material can include, for example, a polyester film, a polyethylene terephthalate (e.g., Mylar), a polymer, or any other material. The material selected for the sheets can be more robust or resistant to damage than the material selected for foam blocks. In such cases, when sensor 220 is assembled, the person placing a foam block and sheet in the sensor may manipulate the sheet instead of the foam block, which may protect the foam block from damage.

A sheet can be coupled to a foam block using any suitable approach. In some embodiments, an adhesive or tape can be used to couple a sheet to a foam block. Alternatively, a heat or pressure based approach can be used to couple the components. As another example, a lamination process can be used to couple a sheet to a foam block. In some cases, the sheet and foam block can instead be separate, and simply held together by a press fit between a side wall and the device cover.

The sheet and foam block can be coupled at any suitable time. In some cases, each of the sheet and foam block can be independently constructed, and subsequently coupled for assembly in sensor 220 or device 200. Alternatively, the sheet and foam block can first be coupled to each other, and subsequently defined using an appropriate process. The particular approach used may depend, in part, on manufacturing processes used for each of the sheet and foam block.

Figure 3:
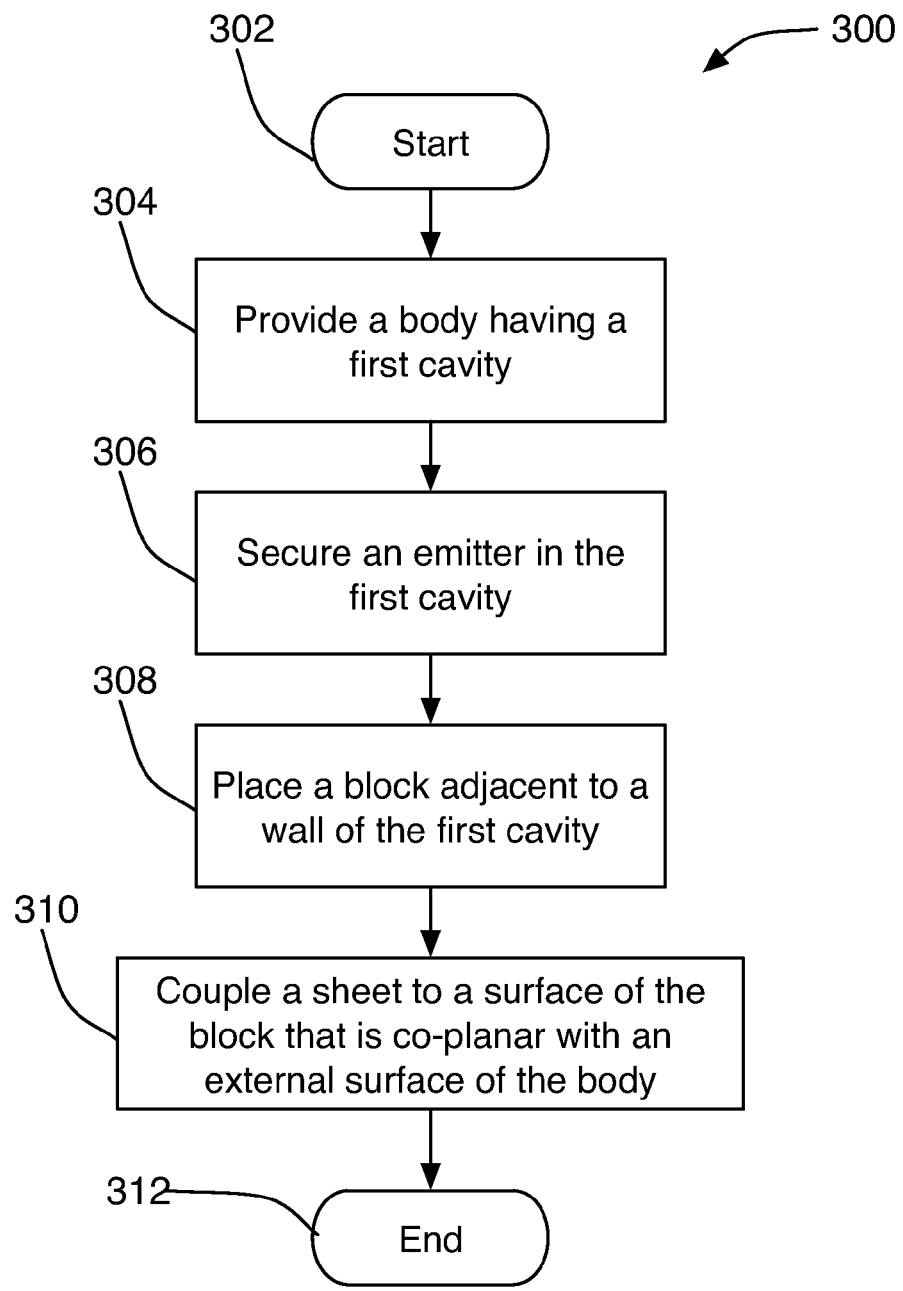
FIG. 3 is a flowchart of an illustrative process for constructing a sensor in accordance with some embodiments of the invention.

FIG. 3 is a flowchart of an illustrative process for constructing a sensor in accordance with some embodiments of the invention. Process 300 can begin at step 302. At step 304, a body that includes a first cavity can be provided. The body can include an outer surface in which the cavity is defined, such that a wall forming a closed loop extends around an opening in the outer surface to define sides for the cavity. At step 306, an emitter can be secured in the first cavity. In some cases, other types of sensors can be placed in the first cavity. At step 308, a block can be placed adjacent to the wall. The block can extend around at least a portion of the opening. In some cases, the block can include a foam block providing a seamless interface between the body and a cover placed over the body. At step 310, a sheet can be coupled to a surface of the block. The particular surface of the block to which the sheet is coupled can include, for example, a surface that is co-planar with the outer surface of the body (e.g., a surface facing out of the cavity), as shown in FIG. 2B. In some cases, the sheet can be constructed from a material that is more resistant to damage than a material used for the block. Process 300 can end at step 312.

Figure 4A:
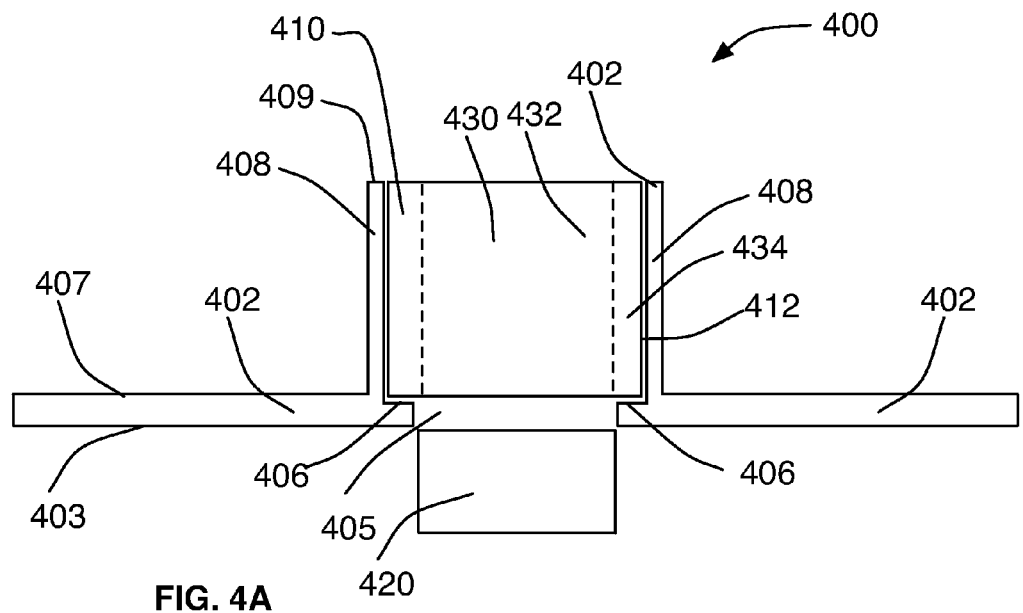
FIG. 4A is a sectional view of an illustrative device enclosure receiving a camera in accordance with some embodiments of the invention.
Figure 4B:
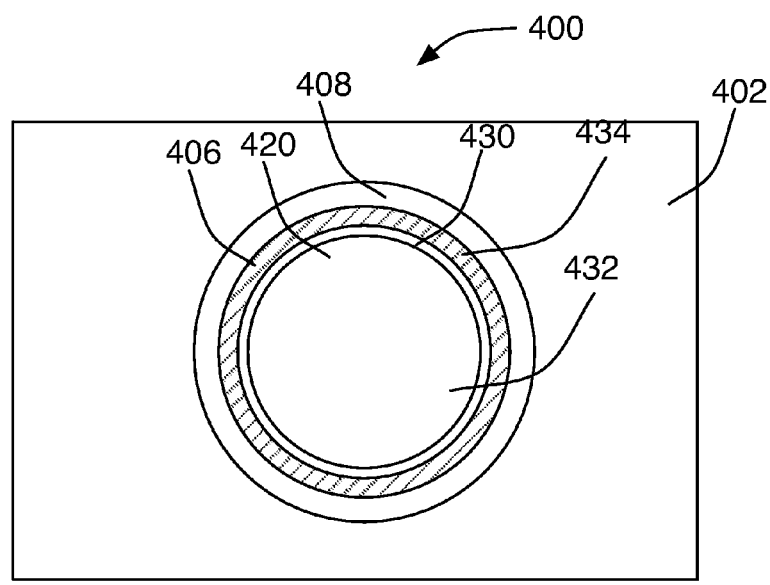
FIG. 4B is a front view of the illustrative electronic device enclosure of FIG. 4A in accordance with some embodiments of the invention.

The electronic device can include several sensors for capturing information from a device environment. In some cases, the electronic device can include a camera. FIG. 4A is a sectional view of an illustrative device enclosure that includes a camera in accordance with some embodiments of the invention. FIG. 4B is a front view of the illustrative electronic device enclosure of FIG. 4A in accordance with some embodiments of the invention. Enclosure 400 can include body 402 forming an external component of the device. For example, enclosure 400 can include a cover (e.g., cover glass), housing, band, or other component providing structure to the device. Body 402 can be constructed from any suitable material including, for example, a metal, glass, plastic, or combination of these (e.g., glass secured to a metal, or metal overmolded with plastic).

To protect the camera lens from damage, camera 420 can be recessed relative to body 402. In some cases, camera 420 can be placed below bottom surface 403 of body 402, such that camera 420 captures images from light passing through opening 405 in body 402. The size of opening 405 can be selected based on properties of the camera including, for example, lens type, sensor size, camera processor, or other properties of the camera.

Although camera 420 may be recessed relative to body 402, it may be desirable to further protect the camera by providing cover 430 coupled to body 402 and positioned over opening 405. Cover 430 can be positioned within cavity 410 created by side walls 408 of body 402, where cavity 410 extends from opening 405 away from camera 420 towards an outer surface of enclosure 400. Cavity 410 can be sized such that the entirety of opening 405 falls within cavity 410 (e.g., walls 408 are offset from a periphery of opening 405). In some cases, cavity 410 can be substantially centered relative to opening 405 to enhance optical or cosmetic attributes of camera 420. The height of cover 430 can substantially match the height of cavity 410 (e.g., the height of walls 408) such that top surface 432 of cover 430 can be substantially flush or co-planar with top surface 409 of walls 408, or with an outer surface of enclosure 400 (e.g., co-planar with a glass cover placed on surface 407 of body 402).

To ensure that the operation of camera 420 is not adversely affected, cover 430 can be constructed from a material that is substantially transparent or translucent. For example, cover 430 can be constructed from a plastic, glass, or composite material. In some cases, the material selected can be resistant to scratching, denting, cracking, or other forms of failure that may affect the quality of images captured through cover 430, the integrity of camera 420 or of the device, the aesthetic appeal of the device, or combinations of these. Some materials can be treated, for example using a coating, a manufacturing process, or by including additives to improve particular mechanical properties of the cover (e.g., an oleophobic coating, an anti-smudge coating, or a heat hardening process).

Cover 430 can be secured to any suitable portion of body 402. Because cover 430 should provide a clear path for light to reach camera 420, however, center region 432 of cover 430 that is aligned with opening 405 should remain unobstructed. This may result in that the amount of cover 430 remaining that may be obstructed by a securing mechanism, or region 434, may be substantially reduced. Region 434 may contact different portions of body 402. For example, region 434 can contact surface 412 of side walls 408. As another example, region 434 can contact edge 406 of body extending between side walls 408 and opening 405. In some cases, the size and disposition of opening 405 can define the width and shape of edge 406. Edge 406 may provide a platform on which cover 430 can rest due to the offset of walls 408 relative to opening 405.

Different approaches can be used to secure cover 430 to one or more of surface 412 and edge 406, or to other portions of body 402. Although the following discussion will describe securing cover 430 to edge 406, it will be understood that some or all of the embodiments described can apply to surface 412 or other surfaces of body 402 that contact cover 430. To reduce the space required to secure cover 430 to body 402, one approach can include using an adhesive.

FIG. 5 is a detailed section view of an interface between a cover and an edge in accordance with some embodiments of the invention. Body 502 can include wall 508 and edge 506 extending at an angle from wall 508 (e.g., vertically from wall 508). Cover 530 can be positioned such that region 532 is not obstructed by edge 506, while region 534 is placed adjacent to edge 506. Bottom surface 536 of cover 530 can be in part secured to surface 507 of edge 506 (i.e., portions of surface 536 that correspond to region 534). In some cases, side surface 538 of cover 530 can instead, or in addition, be at least in part secured to surface 509 of wall 508.

In one approach, a single layer of adhesive can be placed between surfaces 507 and 536 to secure cover 530 to edge 506 (not shown). For example, a pressure sensitive adhesive (PSA) or heat sensitive adhesive can be applied to one or both of surfaces 507 and 536, and cover 530 can be placed in contact with edge 506. In some cases, a fixture can apply pressure to bring the two components together. This approach, however, may have limited effectiveness based on the materials used for cover 530 and edge 506. In particular, a PSA may provide a more fragile bond when cover 530 is constructed from glass and body 502 is constructed from metal.

In some cases, several overlapping layers of materials can be provided on surface 536 of cover 530, as described in more detail below. It will be understood, however, that one or more of the layers can be omitted, or that the order in which the layers are applied can be changed. Some layers of material applied to one or both of cover 530 and edge 506 can improve the performance of a camera may further modify the bond created by a PSA. For example, infrared (IR) layer 542 can be provided on surface 536 to filter infrared light from the camera. As another example, an ultraviolet (UV) filter or other type of filter or material can be applied to surface 536. The layer (e.g., layer 542) can be provided over the portions of surface 536 that correspond to one or both of regions 532 and 534 (not shown). The material used for layer 542, the method of application (e.g., physical vapor deposition, PVD), or other attributes of layer 542 can interact with pressure sensitive adhesive (PSA) 540 and affect the bond created between layer 542 and edge 506.

It may be important, therefore, to improve the bond provided by PSA 540 between layer 542 and edge 506. One approach can include providing ink layer 550 between IR layer 542 and PSA 540. Ink layer 550 can be deposited over IR layer 542 or PSA 540 using any suitable approach including, for example, pad printing or silk screen printing. Properties of the ink used in the ink layer can enhance the bond between IR layer 542 and PSA 540, and thus improve the bond between IR layer 542 and edge 506. The particular pigment or material used for ink layer 550 can be selected based on its effect on PSA 540. In some cases, ink layer 550 may be a black ink layer.

The strength of the bond between cover 530 and edge 506 may be determined from the strength of the bond between edge 506 and IR layer 542, described above, as well as the strength of the bond between cover 530 and IR layer 542. In some cases, an IR layer may have limited adhesive with a material of cover 530, such as glass. For example, an infrared material deposited via PVD may adhere weakly to a glass surface. To strengthen the bond between cover 530 and IR layer 542, a second ink layer 552 can be provided between the cover and IR layer. Ink layer 552 can be deposited on one or both of surface 536 and IR layer 542. Ink layer 552 can be provided using any of the techniques described above. The pigment or material used for ink layer 552 can be the same or different from the pigment or material used for ink layer 550. In some cases, the particular pigment or material can be selected based on properties of the material used for cover 530 or for edge 506.

FIG. 6 is an exploded view of several layers applied to a cover in accordance with some embodiments of the invention. Cover assembly 600 can include cover 630 to be placed over a camera. Cover 630 can have any suitable shape including, for example, a cylindrical shape. In some cases, the shape of cover 630 can include features for direct light in a particular manner (e.g., an indentation, or internal features for guiding light). Cover 630 can include anti-smudge or oleophobic coating 631 applied to an exterior surface of cover 630.

Ink layer 652 can be applied to a surface of cover 630 opposite the surface on which coating 631 is applied. Ink layer 652 can form any suitable shape on cover 630. In some cases, ink layer 652 can define a ring corresponding to regions around a periphery of cover 630 that are supported by a body (e.g., portions of cover 650 that are not aligned with a lens of the camera). IR layer 642 can be applied to cover 630 over ink layer 652. Because IR layer 642 can be applied to cover 630 to improve the performance of the camera, IR layer 642 may be applied over portions of cover 630 that allow light to reach a camera. IR layer 642 may then be applied in part over ink layer 652 and in part directly onto a surface of cover 630.

Additional ink layer 650 can be applied to cover assembly 600 over IR layer 642. Ink layer 650 can cover any suitable portion of IR layer 642. In some cases, ink layer 650 can have substantially the same shape and size as ink layer 652 (e.g., define a ring). Ink layers 650 and 652 can include some or all of the features of ink layers 550 and 552, described above.

Figure 7:
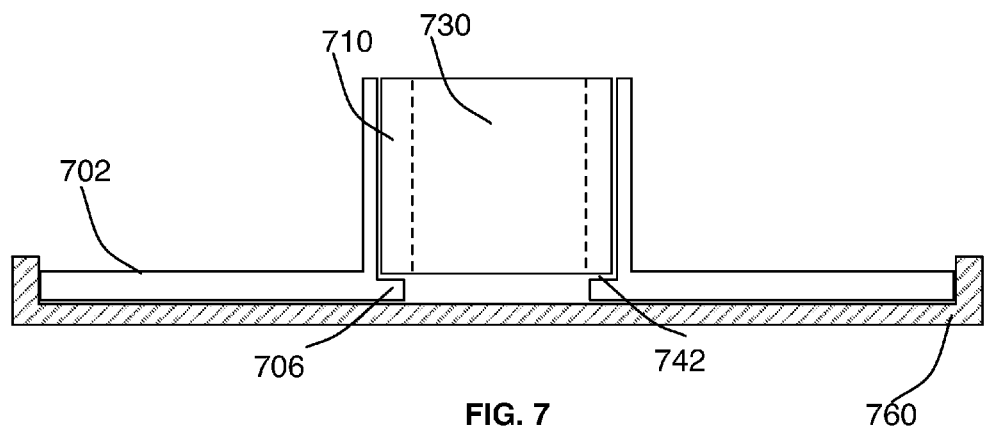
FIG. 7 is a diagram of a fixture retaining a body and a cover in accordance with some embodiments of the invention.

The body and cover can be retained in a fixture during assembly. FIG. 7 is a diagram of a fixture retaining a body and a cover in accordance with some embodiments of the invention. Body 702 can be retained by fixture 760 such that cavity 710 remains exposed. Cover 730 can be placed within cavity 710 such that a surface of cover 730 is adjacent to edge 706 of body 702. One or more layers 742 of ink, IR material, or adhesive can be placed between cover 730 and edge 706 to secure cover 730 to body 702. To improve the adhesion of layer 742, body 702 and cover 730 can be heated or baked (e.g., when a heat sensitive adhesive is used among layers 742). Fixture 760 can be constructed from a material that is compliant and that maintains its shape at high temperatures (e.g., temperatures at which layers 742 are heated). One such material can include silicon, or silicon-based composites.

To ensure that the coupling approach used to connect a cover to an enclosure is suitable, it may be necessary to test the bond provided between the components. For a test to be realistic, however, it should replicate expected modes of failure of devices used in the field. In some cases, when it is subject to different types of impacts. For example, the cover can become detached when a device in which the cover is placed is subject to a large drop, or when the device is subject to repeated smaller impacts. To ensure that consumers will be satisfied with the device, it may be desirable to test the bond between the cover and the body for both types of impacts. Damage from large drops or impacts can be easily tested by dropping the device from a predefined height, and verifying whether or not the cover has become detached. Testing repeated smaller impacts, however, may require a dedicated testing fixture.

Figure 8:
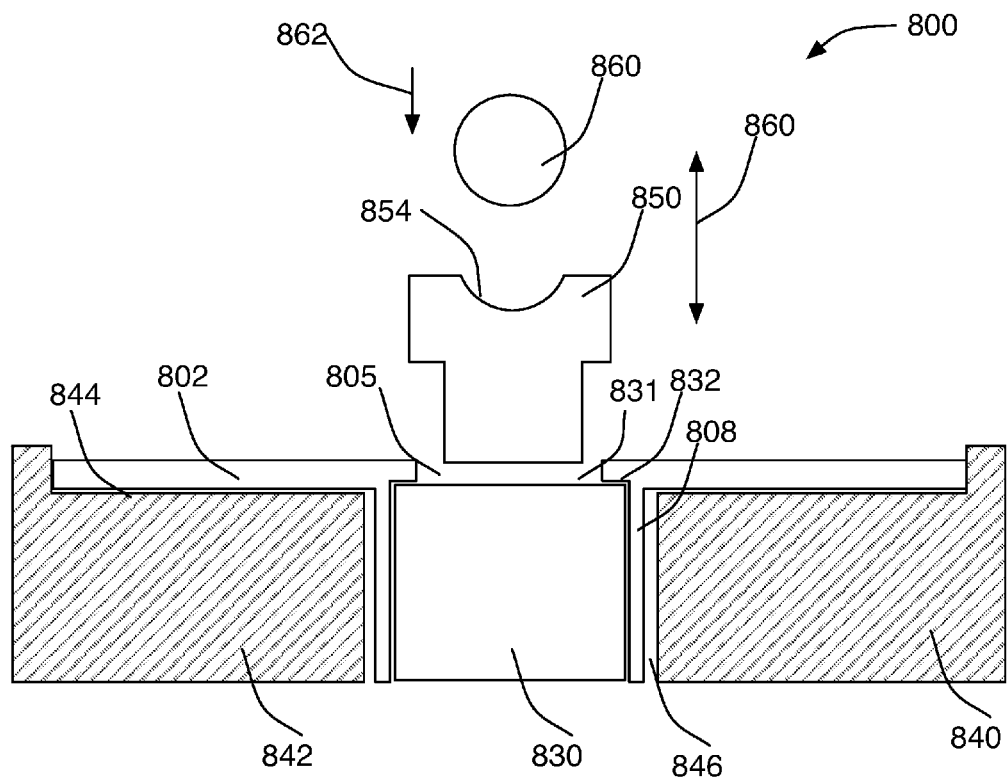
FIG. 8 is a schematic view of an illustrative testing fixture for testing repeated small impacts in accordance with some embodiments of the invention.

FIG. 8 is a schematic view of an illustrative testing apparatus for testing repeated small impacts in accordance with some embodiments of the invention. Fixture 800 can include base 840 having support 842 operative to receive body 802. For example, surface 844 of support 842 can correspond to a shape of body 802. Support 842 can include opening 846 in which wall 808 of body 802, and cover 830 adhered to body 802 by adhesive layer 832, can extend.

Base 840 can be constructed such that opening 805 in body 802 through which light can reach surface 831 of cover 830 is exposed. To test the bond between cover 830 and body 802, fixture 800 can include striker 850 positioned adjacent to surface 831 of cover 830 within opening 805. Striker 850 may be operative to move along an axis perpendicular to surface 831 (e.g., axis 860) to apply a force to dislodge cover 830 from body 802. Striker 850 can include striking surface 852 that substantially matches surface 831 of cover 830 so that striker 850 can apply a uniform force to cover 830.

To apply a consistent and measured force to cover 830, fixture 800 can include ball 860 dropping onto receiving surface 854 of striker 850. Receiving surface 854 can be shaped to receive ball 860 in a consistent and predictable manner. For example, surface 854 can include an indentation corresponding to the curvature of ball 860. Ball 860 can have any suitable shape. For example, ball 860 can include a sphere, a cylinder, a cube, a prism, or any other shape.

The particular force applied by each ball drop can be selected by tuning the weight of the ball, the size of the ball, the size of receiving surface 854, the height from which ball 860 is dropped, or other attributes of striker 850 and ball 860. To test the bond between cover 830 and body 802, ball 860 can be repeatedly dropped on striker 850 from a predetermined height until cover 830 separates from body 802. If the number of drops required to dislodge cover 830 from body 802 exceeds a threshold number, the bond between cover 830 and body 802 can be determined to be adequate. In one approach, ball 860 can be dropped from 1.2 meters at least 30 times. If the cover remains coupled to the body after the 30 drops, the process used to couple the cover to the body may be deemed satisfactory. Although this test may be destructive, it can be used to confirm that a particular process used to couple a cover to a base is satisfactory, or to spot check devices during manufacturing.

Figure 9:
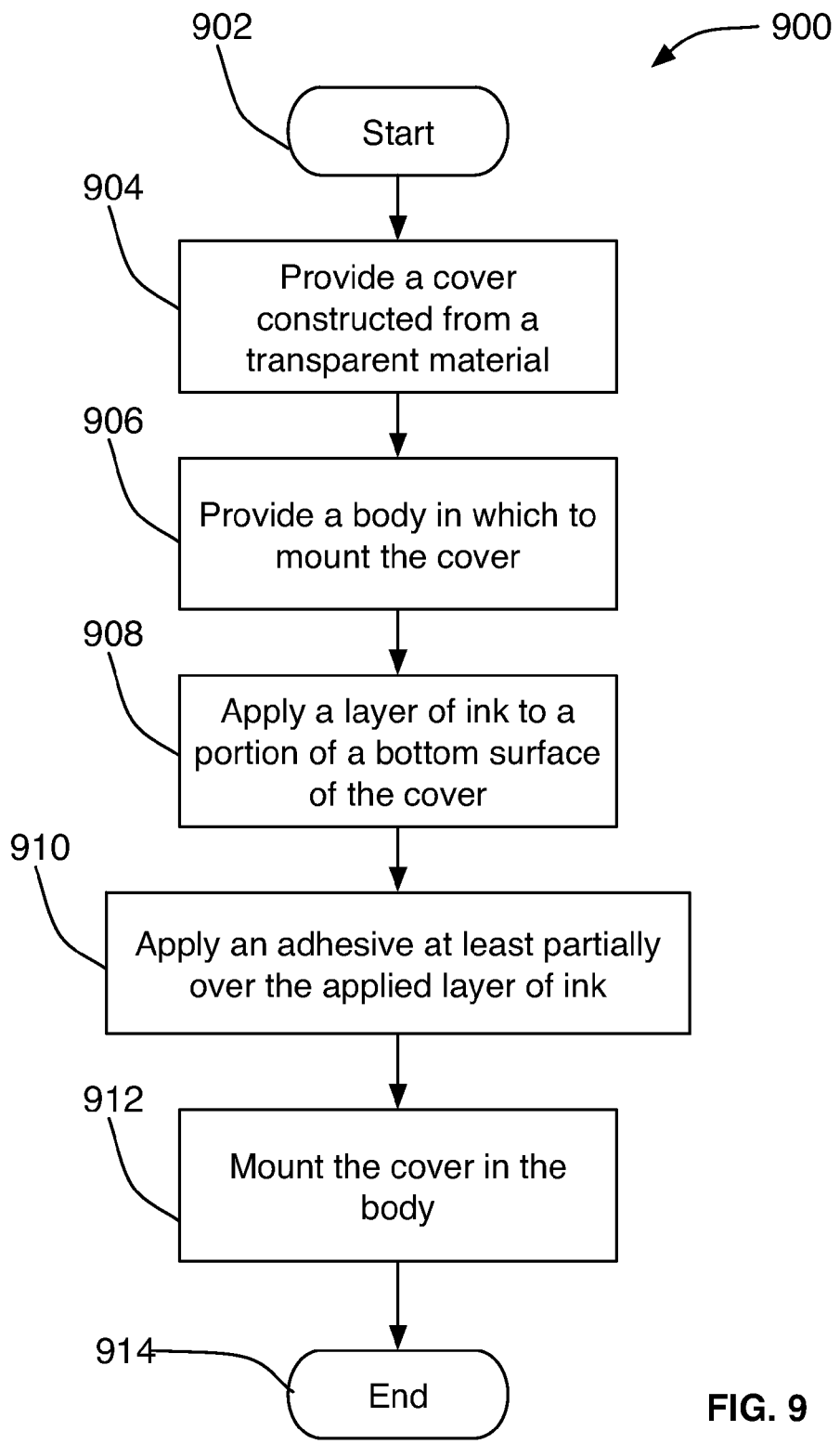
FIG. 9 is a flowchart of an illustrative process for coupling a cover to an edge of an opening in a body in accordance with some embodiments of the invention.

FIG. 9 is a flowchart of an illustrative process for coupling a cover to an edge of an opening in a body in accordance with some embodiments of the invention. Process 900 can begin at step 902. At step 904, a cover constructed from a transparent material can be provided. The cover can define a three-dimensional shape through which light may pass to reach a camera lens. At step 906, a body in which to mount the cover can be provided. The body can include a base having an opening, and a wall extending from the base and surrounding the opening, where the wall is offset from a periphery of the opening to define an edge between the opening and a base of the wall. At step 908, a layer of ink can be applied to a portion of a bottom surface of the cover. At step 910, an adhesive can be applied at least partially over the applied layer of ink. At step 912, the cover can be mounted in the body. In some cases, the applied adhesive can come into contact with the edge when the cover is mounted in the body to secure the cover to the body. Process 900 can then end at step 914.

For many electronic device components to operate properly or most effectively, the components may need to be grounded to provide a return path for signals and power. In some cases, electronic device components may need to be grounded to avoid interferences with more sensitive components, such as audio components or tuning components (e.g., antenna components). Different portions of an electronic device can serve to ground components. For example, a metal enclosure, or an internal metal frame or mid-plate can serve as a ground. As another example, a main logic board can serve as a ground.

Electronic device components can be connected to a ground using different approaches. For example, a wire can connect a component to a ground. Alternatively, other conductive paths can serve to ground an electronic device component. While these approaches can be adequate for grounding components that remain immobile within the device during and after assembly, it may be difficult to ground a component that moves between two positions as the device is assembled. For example, it may be more difficult to ensure that a camera that slides from an initial position during assembly to a final position as a device enclosure is closed remains grounded once the device is assembled.

Figure 10:
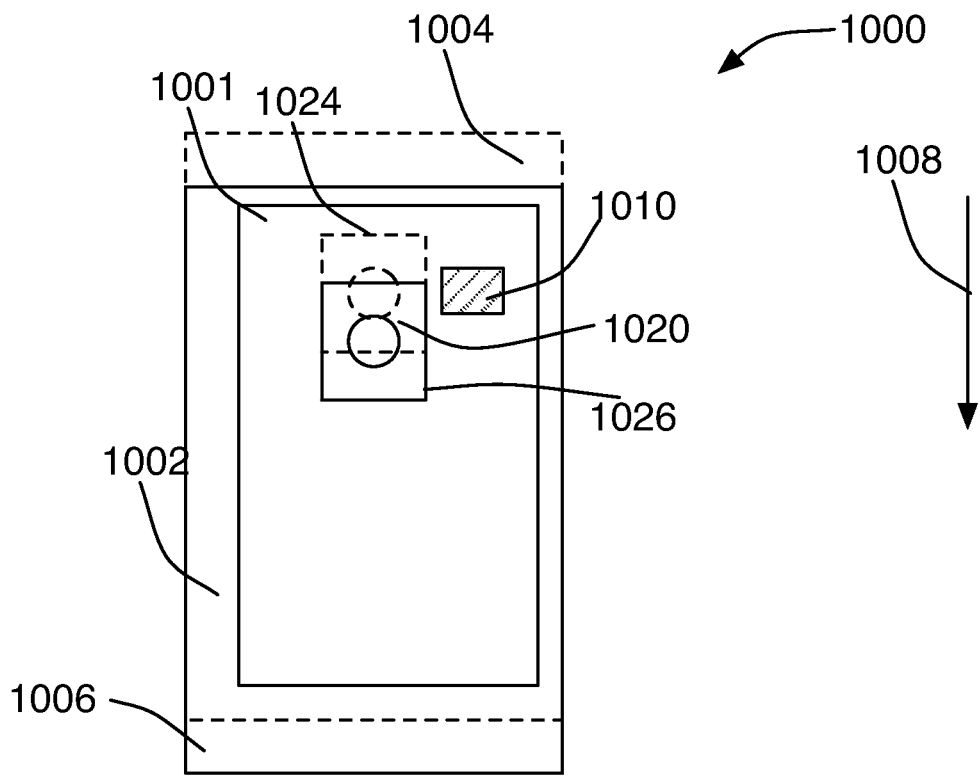
FIG. 10 is a schematic view of a camera as it is assembled in an electronic device enclosure in accordance with some embodiments of the invention.

FIG. 10 is a schematic view of a camera as it is assembled in an electronic device enclosure in accordance with some embodiments of the invention. Enclosure 1000 can include midplate 1001 to which camera 1020 can be secured. In some cases, cover 1002 can be placed over midplate 1001 to close the device and secure camera 1020 within the device. Cover 1002 can be coupled to midplate 1001 using different approaches. In some cases, cover 1002 can be slid over midplate 1001 to engage a coupling mechanism of the enclosure (not shown). For example, cover 1002 can initially be placed in position 1004, and subsequently slid in direction 1008 such that cover 1002 finishes in position 1006.

As cover 1002 slides to position 1006, some components placed on midplate 1001 may move with cover 1002 relative to midplate 1001. For example, camera 1020 may move from initial position 1024, corresponding to initial position 1004 of cover 1002 to final position 1026, corresponding to final position 1006 of cover 1002. The amount by which camera 1020 moves can correspond to the amount by which cover 1002 moves (e.g., both camera 1020 and cover 1002 move by the same amount). The amount of movement can be in the range of 0.1 mm to 5 mm such as, for example, 1 mm.

Figure 11:
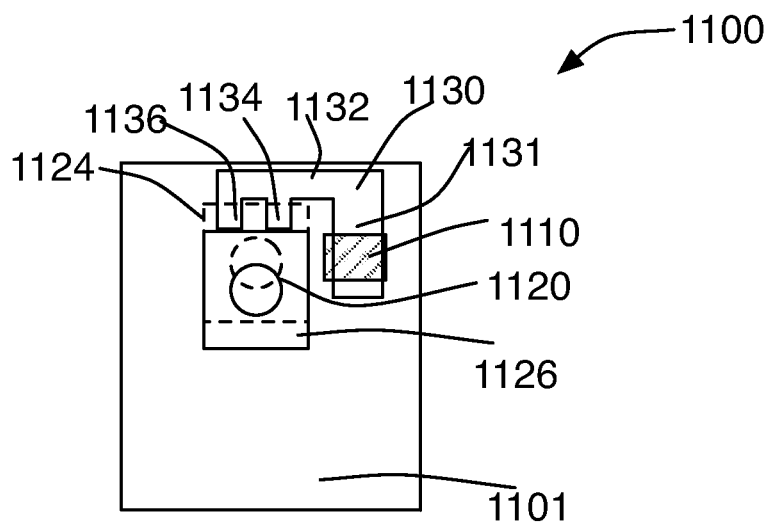
FIG. 11 is a schematic view of a spring used for grounding a camera in accordance with some embodiments of the invention.

As described above, it may be desirable to ground camera 1020 using midplate 1001. For example, midplate 1001 can include grounding platform 1010 which may be connected to camera 1020 by a conductive path. To ensure that camera 1020 is properly grounded, however, it may be desirable to provide a grounding assembly by which camera 1020 is connected to platform 1010 in both positions 1024 and 1026. Several approaches can be used for providing such a grounding assembly. FIG. 11 is a schematic view of a spring used that can be used for grounding a camera in accordance with some embodiments of the invention. Camera 1120 can be mounted on midplate 1101 such that camera 1120 moves from initial position 1124 to final position 1126. Spring 1130 can provide an electrically conductive path between a conductive body of camera 1120 and grounding platform 1110 of mid-plate 1101 (e.g., provide a conductive path between the platform and the housing of the camera). Spring 1130 can be constructed from any conductive material including, for example, a metal. In some cases, spring 1130 can include a conductive coating applied to a non-conductive base.

Spring 1130 can include connection arm 1131 that is connected to platform 1110 for example, using a screw. Connection arm 1131 can extend along the direction of movement of camera 1120. Base arm 1132 can extend from an end of connection arm 1131 at an angle relative to connection arm 1131. For example, base arm 1132 can be perpendicular to connection arm 1131 such that base arm 1132 is positioned opposite a surface of camera 1120 that is substantially perpendicular to the movement of camera 1120. In other words, base arm 1132 can be opposite a surface of camera 1120 that moves towards or away from base arm 1132. The amount of spring force applied by base arm 1132 can therefore be tuned by rotating connection arm 1131, and thus base arm 1132, relative to grounding platform 1110.

To improve the contact between spring 1130 and camera 1120, base arm 1132 can include spring arms 1134 and 1136 extending from base arm 1132 towards camera 1120. In some cases, one or more of spring arms 1134 and 1136 can be substantially parallel to connection arm 1131, and can extend in the direction of movement of camera 1120 from initial position 1124 to final position 1126. The number of spring arms used in spring 1130 can be selected based on a size of camera 1120, the amount of force to apply to camera 1120, a spring constant or deflection associated with each spring arm or with base arm 1132, or combinations of these. In some cases, it may be desirable to provide several spring arms to ensure that spring 1130 remains in contact with camera 1120.

Spring 1130 can be constructed such that, when camera 1120 is in initial position 1124, base arm 1132, spring arm 1134 and spring arm 1136 are all deflected to accommodate camera 1120. When camera 1120 is moved to final position 1126, base arm 1132, spring arm 1134 and spring arm 1136 can all deflect less while remaining in contact with camera 1120. In other words, the amount of deflection required from spring 1130 can change from a larger amount to a lesser amount as camera 1120 moves relative to midplate 1101 from position 1124 to position 1126.

Figure 12A:
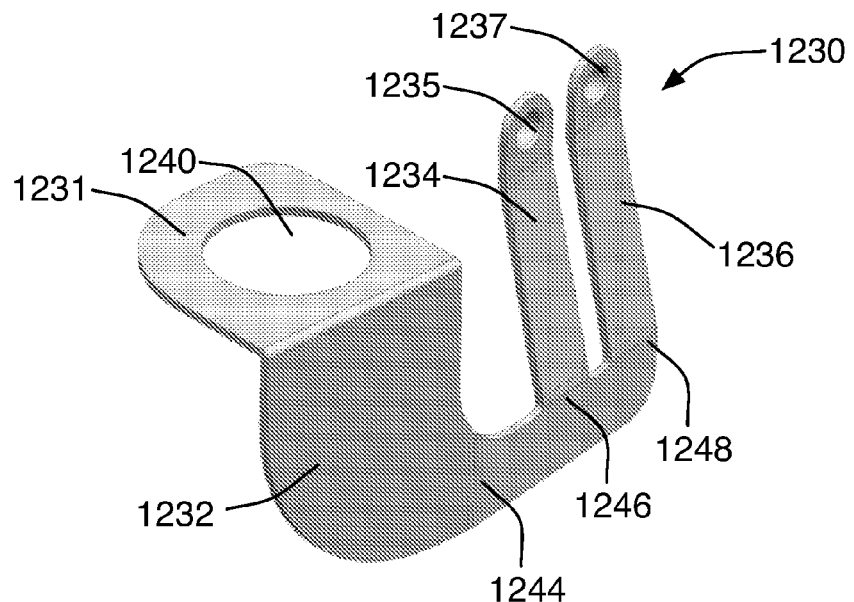
FIG. 12A is a perspective view of an illustrative grounding spring in accordance with some embodiments of the invention.
Figure 12B:
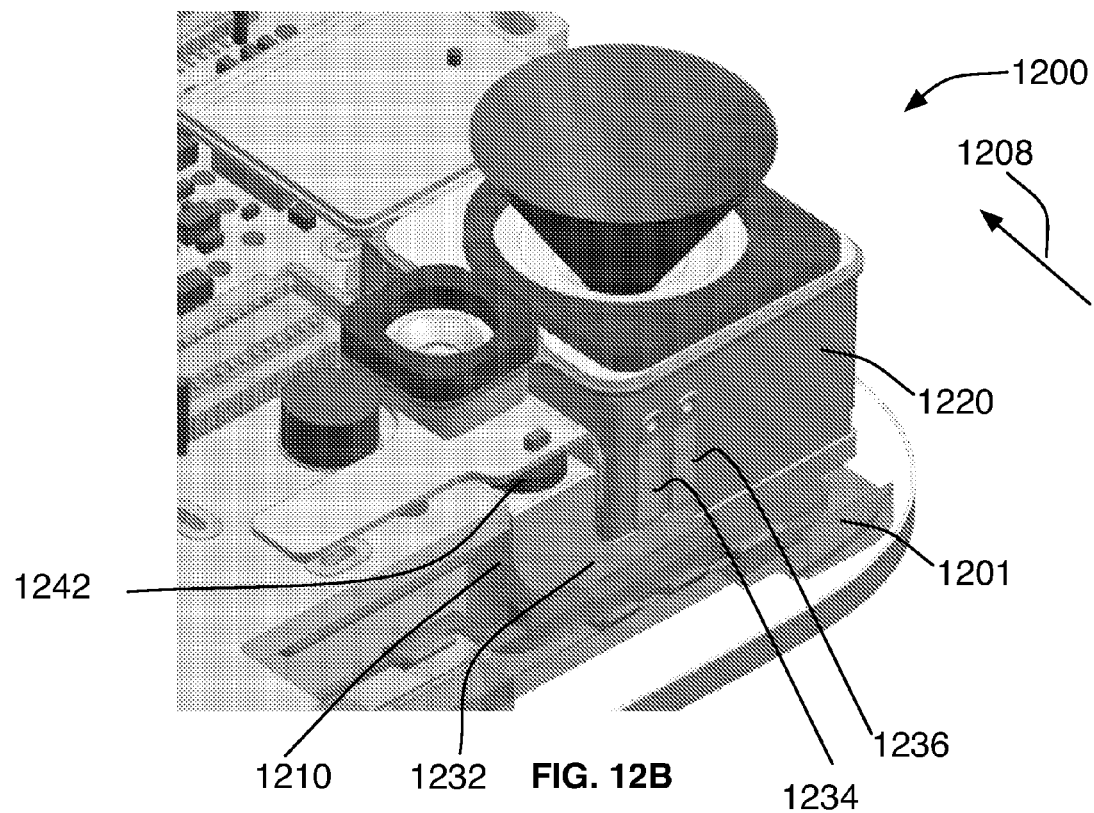
FIG. 12B is a perspective view of the grounding spring of FIG. 12A placed in an electronic device enclosure with a camera in accordance with some embodiments of the invention.

FIG. 12A is a perspective view of an illustrative grounding spring in accordance with some embodiments of the invention. FIG. 12B is a perspective view of the grounding spring of FIG. 12A placed in an electronic device enclosure with a camera in accordance with some embodiments of the invention. Spring 1230 can include connection arm 1231 connected to base arm 1232. In some cases, each of connection arm 1231 and base arm 1232 can be provided in different planes that are substantially perpendicular (such as the configuration shown in FIG. 12A). Connection arm 1231 can include opening 1240 through which screw 1242 (FIG. 12B) or another connector can be provided to secure connection arm 1231 to grounding platform 1210 of midplate 1201.

Spring 1230 can include spring arms 1234 and 1236 extending from base arm 1232. Spring arms 1234 and 1236 can be biased out of the plane of base arm 1232 towards opening 1240 (e.g., towards camera 1220 that spring 1230 will ground). Spring arms 1234 and 1236 can include indentations 1235 and 1237, respectively, at tips of the arms to provide a contact point for the spring arms.

Spring 1230 can include several regions at which bending may be facilitated to allow spring 1230 to deflect. For example, base arm 1232 can include elongated region 1244 extending across base arm 1232 (e.g., extending along the axis of spring arms 1234 and 1236) for enabling base arm 1232 to deflect out of the plane of the arm. As another example, spring arm 1234 can include regions 1246 extending across spring arm 1234, and spring arm 1236 can include region 1248 extending across spring arm 1236 to enable spring arms 1234 and 1236 to deflect. Regions 1246 and 1248 can include elongated regions extending along the axis of base arm 1232. As discussed above, the amount of deflection provided by spring 1230 can be tuned by rotating spring 1230 around screw 1242 to change the orientation of spring 1230 relative to camera 1220.

In some cases, other approaches can be used to provide a grounding path between a midplate platform and a camera housing. FIG. 13 is a schematic view of a camera housing grounded using a clip in accordance with some embodiments of the invention. Camera 1320 can be mounted on midplate 1301 such that camera 1320 moves from initial position 1324 to final position 1326. Grounding clip assembly 1330 can provide an electrically conductive path between a conductive body of camera 1320 and grounding platform 1310 of midplate 1301 (e.g., provide a conductive path between the platform and the housing of the camera).

Clip assembly 1330 can include clip 1331 coupled to platform 1310, for example using a fastener. Clip 1331 can include a base plate having an opening for securing clip 1331 to the platform, and a clip portion having a fold for securing flex 1332 of clip assembly 1330. Clip 1331 can be constructed from any suitable conductive material to ensure that a conductive path is provided through clip assembly 1330.

Clip assembly 1330 can include flex 1332 providing a conductive path between camera 1320 and clip 1331. Flex 1332 can include several distinct sections having different properties. For example, flex 1332 can include rigid section 1334 operative to be placed in the clip portion of clip 1331, rigid section 1338 operative to be coupled to camera 1320, and flexible section 1336 connecting rigid sections 1334 and 1338. Rigid section 1334 can include an exposed conductive surface such that a conductive path can be provided between rigid section 1334 and clip 1331. Similarly, rigid section 1338 can be coupled to camera 1320 such that an electrically conductive path is provided between camera 1320 and rigid section 1338.

Flexible section 1336 can provide a conductive path between rigid sections 1334 and 1338. Because camera 1320 may move, the distance between rigid sections 1334 and 1338 may vary. To accommodate the variation in distance, flexible section 1336 can include a service loop or other excess material that enables rigid sections 1334 and 1338 to move relative to one another when camera 1320 is moved within enclosure 1300. The length of flexible section 1336 can be selected such that flex 1332 can be secured to camera 1320 (e.g., via rigid section 1338) and to clip 1331 (e.g., via rigid section 1334) when camera 1320 is either in position 1324 or in position 1336. The length of flexible section 1336 can be selected based on the travel of camera 1320. Clip 1331 can secure rigid portion 1334 using any suitable approach.

FIG. 14A is a schematic view of an illustrative clip for grounding a camera in accordance with some embodiments of the invention. Grounding clip 1400 can include base plate 1402 by which clip 1400 can be coupled to a grounding platform. In some cases, base plate 1402 can include an opening through which a screw may pass. Clip 1400 can include spring wall 1410 extending from base plate 1402 and folded over itself to define cavity 1414. Wall 1410 can be biased such that end 1412 of wall 1410 comes into contact with or is adjacent to tip 1404 of base plate 1402. In this manner, when a rigid section of a flex (such as one of rigid sections 1334 and 1338 described above) is placed in cavity 1414, wall 1410 can ensure that at least end 1412 and tip 1404 come into contact with and retain the rigid section of the flex.

In some cases, a portion of the wall other than the end can close or reduce the opening of a cavity defined by the wall. FIG. 14B is a schematic view of another illustrative clip for grounding a camera in accordance with some embodiments of the invention. Similar to grounding clip 1400, grounding clip 1420 can include base plate 1422 by which clip 1420 can be coupled to a grounding platform. In some cases, base plate 1422 can include an opening through which a screw may pass. Clip 1420 can include spring wall 1430 extending from base plate 1422 and folded over itself to define cavity 1434. Wall 1430 can be biased such that point 1432 along wall 1430 can come into contact with or be adjacent to another portion of wall 1430 (e.g., point 1436). In this manner, when a rigid section of a flex is placed in cavity 1434, wall 1430 can ensure that at least points 1432 and 1436 come into contact with and retain the rigid section of the flex.

Figure 15A:
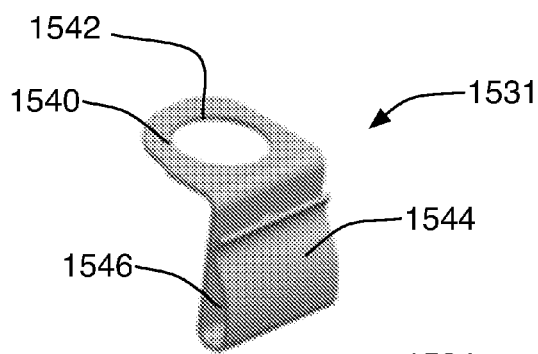
FIG. 15A is a perspective view of an illustrative clip for grounding a camera in accordance with some embodiments of the invention.
Figure 15B:
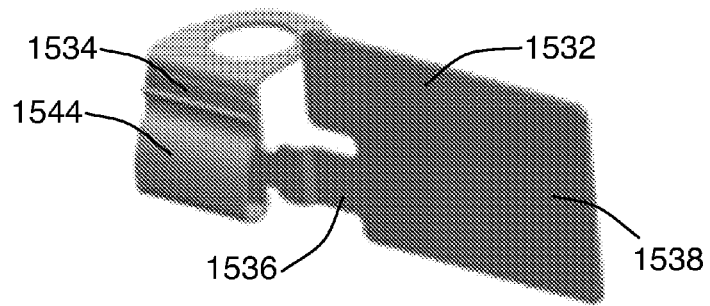
FIG. 15B is a perspective view of the illustrative clip of FIG. 15A in which a flex is placed in accordance with some embodiments of the invention.
Figure 15C:
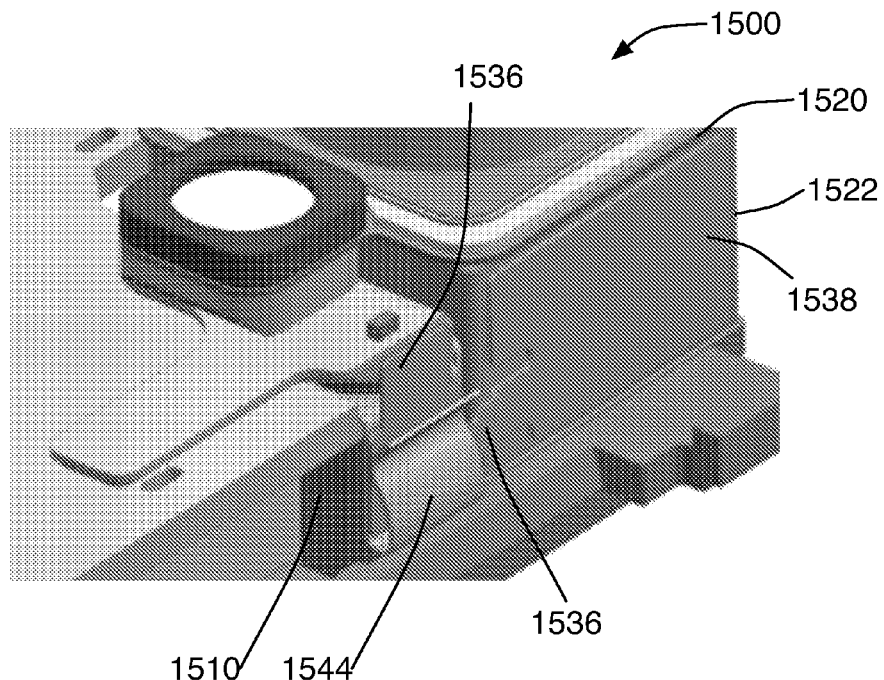
FIG. 15C is a perspective view of the illustrative clip and flex of FIG. 15B placed in an electronic device in accordance with some embodiments of the invention.

FIG. 15A is a perspective view of an illustrative clip for grounding a camera in accordance with some embodiments of the invention. FIG. 15B is a perspective view of the illustrative clip of FIG. 15A in which a flex is placed in accordance with some embodiments of the invention. FIG. 15C is a perspective view of the illustrative clip and flex of FIG. 15B placed in an electronic device in accordance with some embodiments of the invention. Grounding clip 1531 can include base plate 1540 having opening 1542 for coupling base plate 1540 to grounding platform 1510. Wall 1544 can extend from base plate 1540 to define cavity 1546 in which a flex can be received. In particular, rigid section 1534 of flex 1532 can be received within cavity 1546 and retained by wall 1544, as shown in FIG. 15B.

When assembled within enclosure 1500, rigid section 1538 of flex 1532 can be coupled to a body or housing of camera 1520. For example, rigid section 1538 can include a planar element operative to be coupled to surface 1522 of camera 1520 (e.g., soldered or coupled using a conductive adhesive). Flexible section 1544 can deform based on a position of camera 1520 relative to platform 1510 (and thus relative to enclosure 1500).

Figure 16:
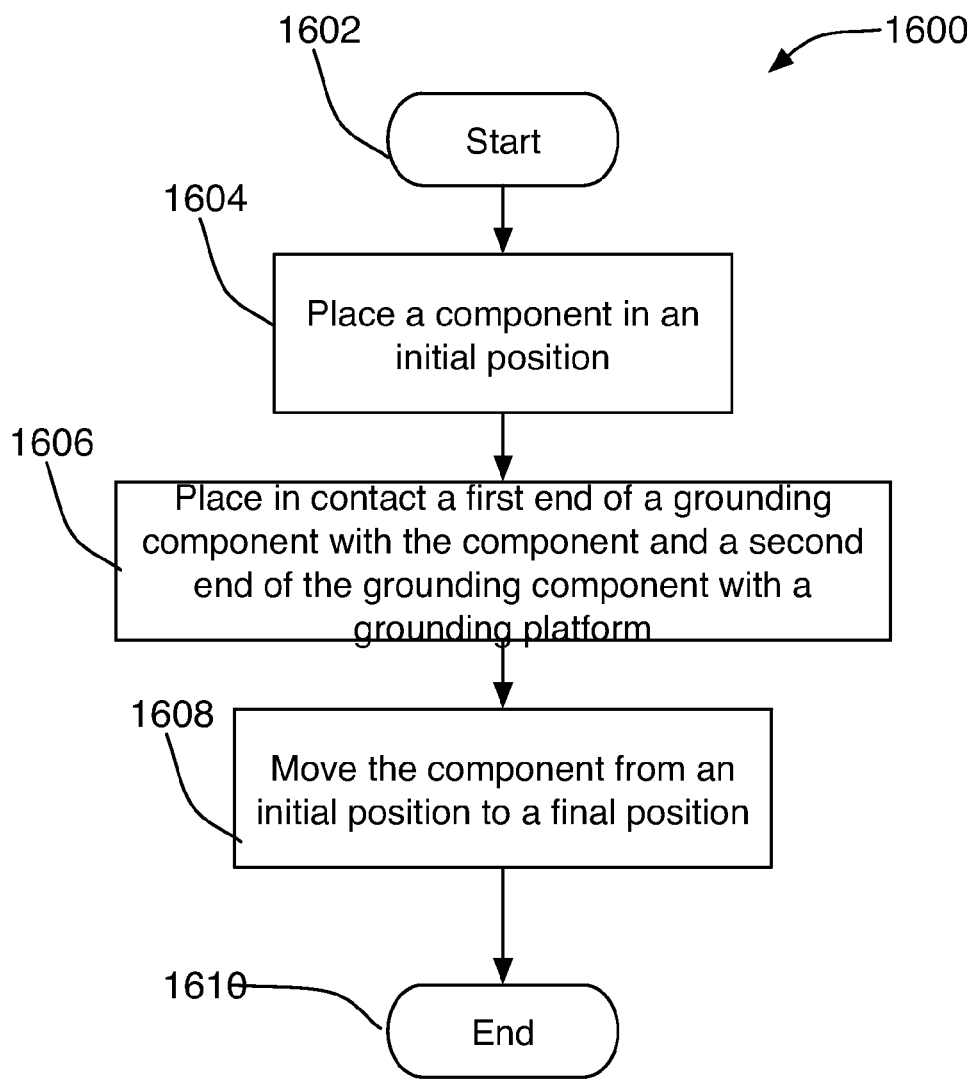
FIG. 16 is a flowchart of an illustrative process for grounding a component in an electronic device in accordance with some embodiments of the invention.

FIG. 16 is a flowchart of an illustrative process for grounding a component in an electronic device in accordance with some embodiments of the invention. Process 1600 can begin at step 1602. At step 1604, a component can be placed in an initial position relative to an enclosure of an electronic device during assembly of the device. For example, a camera can be placed in an initial position when a cover is not placed over a midplate of the device. At step 1606, a first end of a grounding component can be placed in contact with the component and a second end of the grounding component can be placed in contact with a grounding platform within the enclosure. For example, a spring can be coupled to a grounding platform such that spring arms of the spring are in contact with a component. As another example, a grounding clip can be coupled to a grounding platform, and a flex can be connected to the component at one end and placed in the clip. More generally, a base can be coupled to a grounding platform, and a connector can be coupled to the component. At step 1608, the component can be moved from the initial position to a final position when the enclosure is closed. The grounding component can move to accommodate the change in position of the component so that a ground in maintained at all times (both during the assembly process, and after assembly has been completed). For example, the spring can deflect to accommodate the change in component position. As another example, a flexible section of the flex can deflect when the component position changes. Process 1600 can then end at step 1610.

Figure 17A:
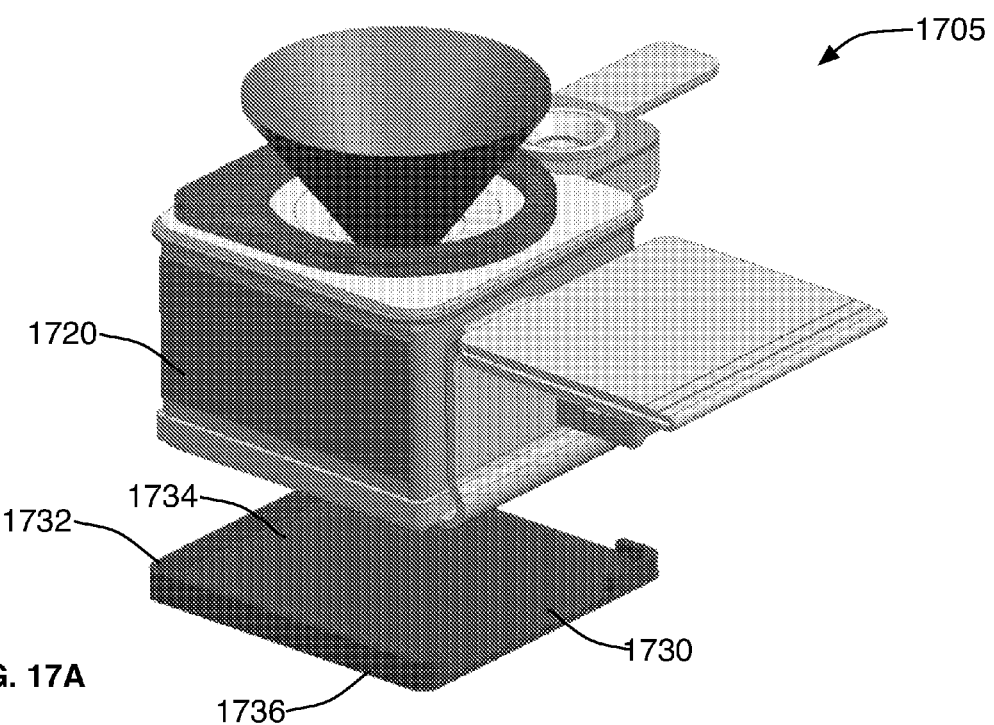
FIG. 17A is an exploded view of a camera assembly placed in an electronic device in accordance with some embodiments of the invention.
Figure 17B:
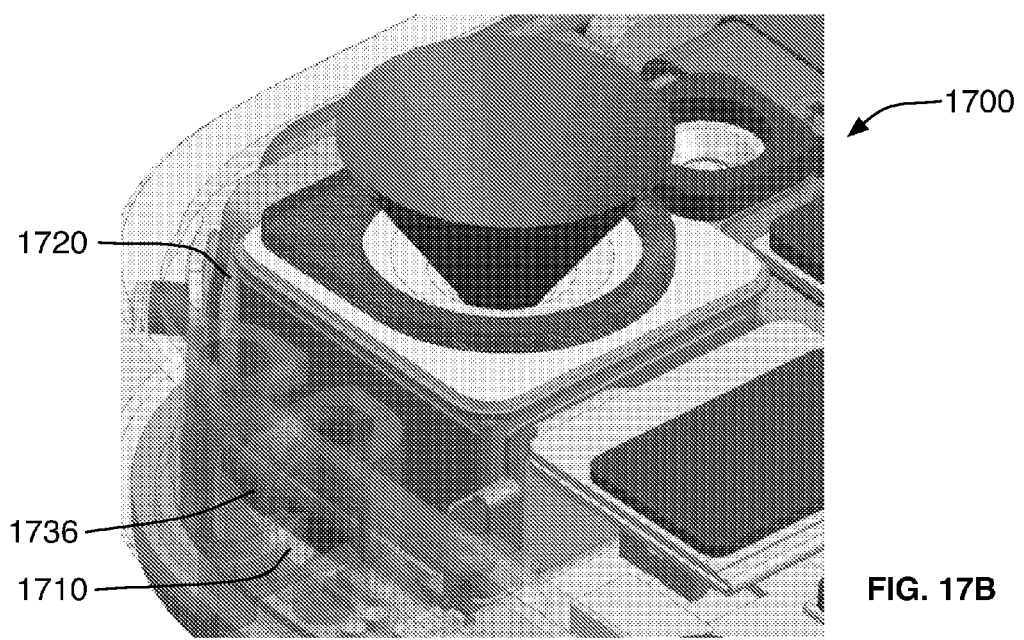
FIG. 17B is a perspective view of the camera assembly of FIG. 17A placed in an electronic device in accordance with some embodiments of the invention.

Some components of an electronic device may require damping to ensure that they operate properly. For example, a camera may operate best when vibrations of the lens are dampened. FIG. 17A is an exploded view of a camera assembly placed in an electronic device in accordance with some embodiments of the invention. FIG. 17B is a perspective view of the camera assembly of FIG. 17A placed in an electronic device in accordance with some embodiments of the invention. Camera assembly 1705 can include camera 1720 operative to capture light received from outside of a device. To dampen vibrations that other electronic device components may generate and that may interfere with camera 1720, camera assembly 1705 can include boot 1730 in which camera 1720 is placed. In particular, boot 1730 can include side wall 1732 extending around some or all of a periphery of camera 1720 to secure the camera within boot 1730. Camera 1720 may be placed adjacent to inner surface 1734 of boot 1730. Outer surface 1736 can be placed adjacent to an electronic device component (e.g., midplate 1710) when camera assembly 1700 is placed in electronic device 1700.

Figure 18:
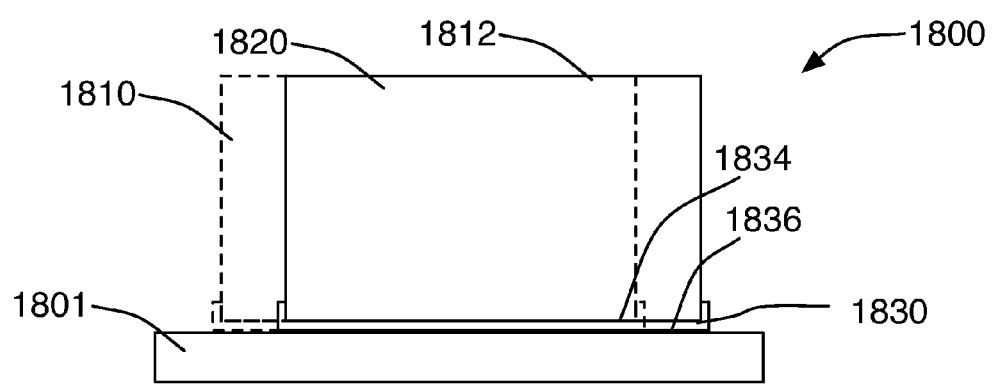
FIG. 18 is a sectional view of an illustrative camera and boot placed in an electronic device in accordance with some embodiments of the invention.

In some cases, a camera assembly may move within an electronic device during assembly, as discussed above. FIG. 18 is a sectional view of an illustrative camera and boot placed in an electronic device in accordance with some embodiments of the invention. Electronic device 1800 can include midplate 1801 operative to receive camera 1820. Camera 1820 can be placed within boot 1830 to dampen vibrations and improve the performance of the camera. When camera 1820 and boot 1830 are initially placed in electronic device 1800, they may be provided in position 1810. Once assembly is completed, however, the camera and boot may be displaced to position 1812.

For boot 1830 and camera 1820 to slide smoothly across midplate 1801, however, it may be necessary that the interface between boot 1830 (e.g., bottom surface 1836) and midplate 1801 be slippery. To ensure that camera 1820 is not removed from boot 1830 while boot 1830 slides, however, it may be desirable for the interface between boot 1830 (e.g., top surface 1834) and camera 1820 to be sticky or adhering. One approach for providing a boot having one slippery surface and one sticky surface may be to create a boot having two slippery surfaces, and adding an adhesive to one of the surfaces. This approach, however, can increase the size of the camera assembly.

Another approach can be to define boot 1830 such that surfaces 1834 and 1836 have different textures. For example, surface 1834 can have a substantially smooth texture, and therefore a high coefficient of friction, while surface 1836 can have a substantially rugged or rough texture, and therefore a low coefficient of friction. Boot 1830, having these two different textures, can be constructed using different approaches. In some embodiments, a compression molding process can be used. The mold can be textured such that the surfaces of boots created using the mold have the desired textures. For example, one surface of the mold can be sandblasted to create a rough texture, while an opposite surface of the mold can be polished to create a smooth texture. The material used for boot 1830 can be selected based on its coefficient of friction, damping properties, ease of manufacturing, or other criteria. In some cases, boot 1830 can be constructed from silicon.

It is to be understood that the steps shown in the flowcharts above are merely illustrative and that existing steps may be modified or omitted, additional steps may be added, and the order of certain steps may be altered. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. Furthermore, the previously described embodiments are presented for purposes of illustration and not of limitation. It is understood that one or more features of an embodiment can be combined with one or more features of another embodiment to provide systems and/or methods without deviating from the spirit and scope of the invention.

What is claimed is:

1. A method for coupling a cover to a body of an electronic device wherein the body comprises a base comprising an opening and an edge surrounding a periphery of the opening, wherein the electronic device comprises a camera, comprising:
    applying a layer of ink on a portion of a bottom surface of the cover;
    applying an adhesive at least partially over the applied layer of ink; and
    mounting the cover in the body such that the cover is placed over the opening and the camera, the applied adhesive comes into contact with the edge when the cover is mounted in the body, and a portion of the cover overlaps with the edge.

2. The method of claim 1, wherein the body further comprises a wall extending from the base around the periphery of the opening, wherein the edge extends between the wall and the periphery of the opening.

3. The method of claim 1, wherein mounting the cover further comprises placing the cover in a volume enclosed by the wall, and wherein the cover defines a three-dimensional shape.

4. The method of claim 3, wherein the volume enclosed by the wall corresponds to the three-dimensional shape of the cover.

5. The method of claim 4, wherein placing the cover comprises placing the cover such that the side surface is adjacent to the wall and the bottom surface is adjacent to the edge.

6. The method of claim 1, further comprising:
    applying an infrared layer to the bottom surface.

7. The method of claim 6, further comprising:
    applying a second ink layer on the bottom surface;
    applying the infrared layer at least partially over the second ink layer; and
    applying the ink layer at least partially over the infrared layer.

8. The method of claim 1, wherein the ink layer defines a ring on the bottom surface of the cover.

9. The method of claim 8, wherein the shape of the ring corresponds to the shape of the edge around the periphery of the opening.

10. The method of claim 1, further comprising enhancing the adhesion of the adhesive by heating the cover.

11. A method for coupling a cover assembly to an enclosure for protecting a camera lens, wherein the cover assembly comprises a cylindrical structure constructed from a transparent material, wherein the cylindrical structure comprises a top surface, a bottom surface, and a side surface, wherein the top and bottom surfaces substantially comprise discs, comprising:

applying a first ink layer to a ring-shaped region of the bottom surface; and applying an adhesive layer applied over the first ink layer, wherein the adhesive layer is operative to adhere to a body to which the cover assembly is mounted.

12. The method of claim 11, further comprising:

applying an infrared layer over the first ink layer to the entirety of the bottom surface; and applying a second ink layer to the ring-shaped region of the bottom surface over the infrared layer.

13. The method of claim 11, wherein the ring-shaped region extends from a periphery of the bottom surface towards a center of the bottom surface.

14. The method of claim 13, wherein dimensions of a disc-shaped region within the ring-shaped region correspond to dimensions of the camera lens over which the cover assembly is placed.

15. A method of forming an electronic device enclosure, wherein the electronic device comprises a sensor, a transparent cover, and a body for receiving the transparent cover, wherein the body comprises an opening and an edge around a periphery of the opening, wherein the transparent cover is received such that a portion of the transparent cover overlaps with the edge, comprising:

applying a first ink layer to a surface of the transparent cover along the portion of the transparent cover;

applying an adhesive layer positioned between the ink layer and the edge to couple the transparent cover to the body; and coupling the transparent cover to the body such that the transparent cover is aligned with the sensor.

16. The method of claim 15, wherein the body further comprises a wall extending from the base around the periphery of the opening, wherein the edge extends between the wall and the periphery of the opening.

17. The method of claim 16, further comprising:

placing the cover in a volume enclosed by the wall, wherein the cover defines a three-dimensional shape.

18. The method of claim 17, wherein the volume enclosed by the wall corresponds to the three-dimensional shape of the cover.

19. The method of claim 15, wherein applying a first ink layer comprises forming an opaque region on the cover.

20. The method of claim 19, wherein forming an opaque region on the cover comprises forming a disc-shaped transparent region of the cover within the opaque region, wherein the disc-shaped transparent region is aligned with the sensor.

* * * * *